(12) United States Patent
Suzuki et al.

(10) Patent No.: US 7,642,947 B2
(45) Date of Patent: Jan. 5, 2010

(54) DATA PROCESSING METHOD, DATA PROCESSING DEVICE, SOLID-STATE IMAGING DEVICE, IMAGING APPARATUS, AND ELECTRONIC DEVICE

(75) Inventors: Atushi Suzuki, Kanagawa (JP); Taaki Watanabe, Kanagawa (JP)

(73) Assignee: Sony Corporation, Tokyo (JP)

( * ) Notice: Subject to any disclaimer, the term of this patent is extended or adjusted under 35 U.S.C. 154(b) by 117 days.

(21) Appl. No.: 12/045,417

(22) Filed: Mar. 10, 2008

(65) Prior Publication Data

US 2008/0224913 A1 Sep. 18, 2008

(30) Foreign Application Priority Data

Mar. 12, 2007 (JP) ............................. 2007-061568

(51) Int. Cl.
*H03M 1/56* (2006.01)
(52) U.S. Cl. ...................... 341/169; 341/118; 341/155
(58) Field of Classification Search .................. 341/155, 341/169
See application file for complete search history.

(56) References Cited

U.S. PATENT DOCUMENTS 5,877,715 A * 3/1999 Gowda et al. ............... 341/122
7,129,883 B2 * 10/2006 Muramatsu et al. ......... 341/164
7,227,488 B2 * 6/2007 Cho .......................... 341/155

FOREIGN PATENT DOCUMENTS

GB 2 317 526 A 3/1998
JP 2005-323331 11/2005

OTHER PUBLICATIONS

A European Search Report in counterpart EP Application No. 08004416.7-2202 dated Dec. 30, 2008.
D. Lee, et al. High-Speed, low-power correlated double sampling counter for column-parallel CMOS imagers. Nov. 22, 2007.

* cited by examiner

*Primary Examiner*—Khai M Nguyen
(74) *Attorney, Agent, or Firm*—Sonnenschein Nath & Rosenthal LLP

(57) ABSTRACT

A data processing device includes a comparing unit that compares a reference signal and respective processing object signals, a count-period control unit that determines a count period to perform count processing, a count unit that performs the count processing in the count period designated by the count-period control unit, stores a count value, applies the count processing to both a subtraction element and an addition element in an identical mode of any one of an up-count mode and a down-count mode, and starts the count processing for a following processing object signal using a count value for a preceding processing object signal as an initial value, and a correcting unit that corrects digital data of a multiply-accumulate result of the plural processing object signals to digital data in which a count value is corrected.

11 Claims, 13 Drawing Sheets

<OPERATION PRINCIPLE OF FIRST EXAMPLE: DIFFERENCE PROCESSING IN UP-COUNT MODE>

Srst: SUBTRACTION ELEMENT
Ssig: ADDITION ELEMENT

<OPERATION PRINCIPLE OF SECOND EXAMPLE: DIFFERENCE PROCESSING IN DOWN-COUNT MODE>

Srst: ADDITION ELEMENT
Ssig: SUBTRACTION ELEMENT

<OPERATION PRINCIPLE OF THIRD EXAMPLE: ADDITION PROCESSING BETWEEN TWO PIXELS>

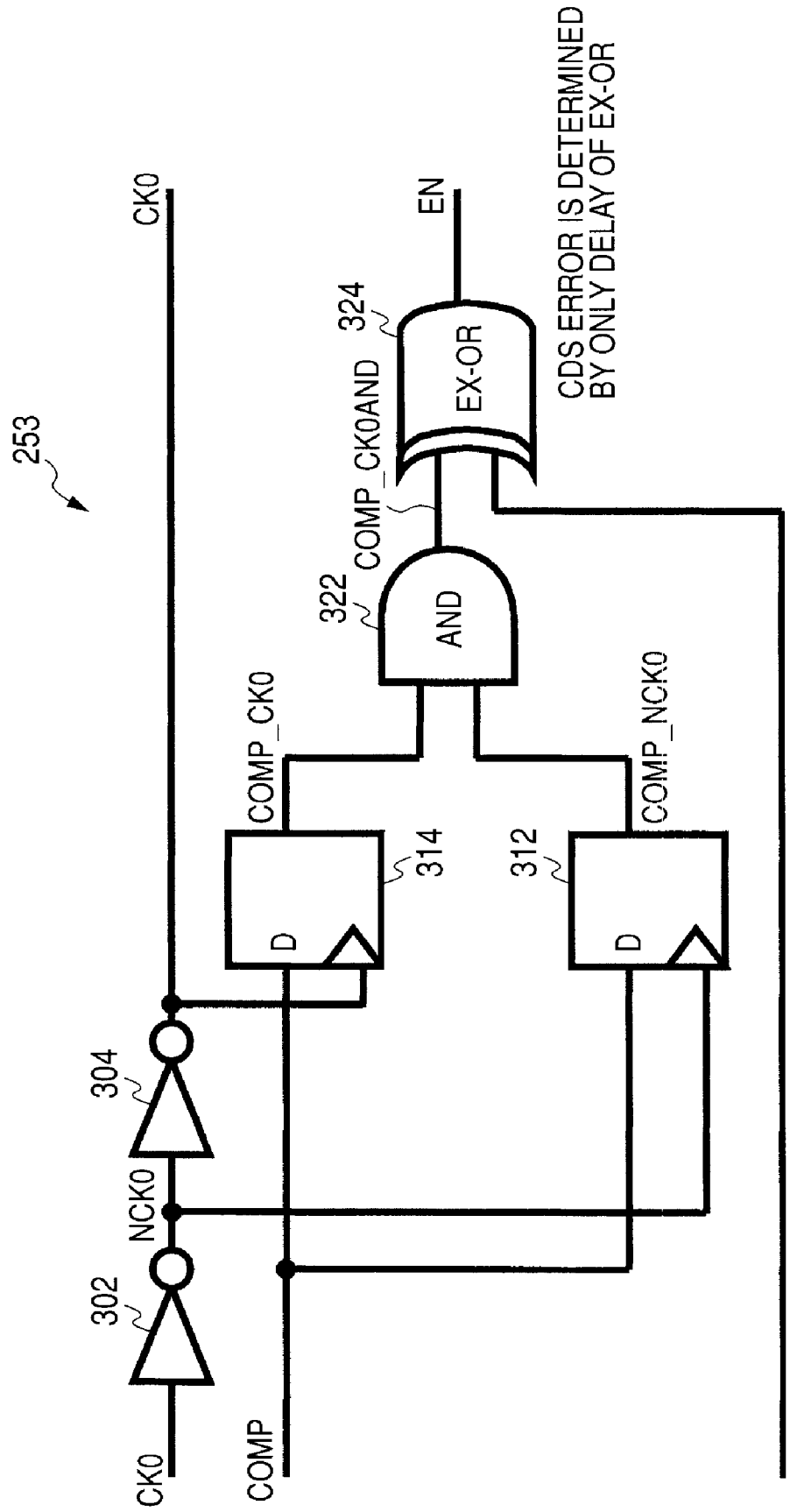

<PHSEL UNIT TIMING CHART: P PHASE (SEL=1)>

<PHSEL UNIT TIMING CHART: D PHASE (SEL=0)>

DATA PROCESSING METHOD, DATA PROCESSING DEVICE, SOLID-STATE IMAGING DEVICE, IMAGING APPARATUS, AND ELECTRONIC DEVICE

CROSS-REFERENCES TO RELATED APPLICATIONS

The present invention contains subject matter related to Japanese Patent Application JP 2007-061568 filed in the Japanese Patent Office on Mar. 12, 2007, the entire contents of which being incorporated herein by reference.

BACKGROUND OF THE INVENTION

1. Field of the Invention

The present invention relates to a data processing method and a data processing device involving AD (analog-digital) conversion, a solid-state imaging device, which is an example of a semiconductor device for detecting a physical quantity distribution employing a mechanism of the AD conversion, an imaging apparatus, and an electronic device. More specifically, the present invention relates to a digital signal processing technique suitably used for a semiconductor device for detecting a physical quantity distribution and other electronic devices such as a solid-state imaging device that is formed by arraying plural unit components, which have sensitivity to electromagnetic waves inputted from the outside such as light and radiations, and can arbitrarily select, using address control, a physical quantity distribution converted into an electric signal by the unit components and read out the physical quantity distribution as the electric signal. More particularly, the present invention relates to a technique for acquiring digital data subjected to an arithmetic operation in treating plural kinds of processing object signals.

2. Description of the Related Art

In recent years, as examples of a solid-state imaging device, image sensors of a MOS (Metal Oxide Semiconductor) type and a CMOS (Complementary Metal-Oxide Semiconductor) type that can overcome various problems of a CCD (Charge Coupled Device) image sensor attract attention.

For example, the CMOS image sensor has, for each of pixels, an amplifier including a floating diffusion amplifier. In reading out a pixel signal, as an example of address control, a system of a so-called column parallel output type or column type is often used. This is a system for selecting one row in a pixel array section, simultaneously accessing pixels for the one row, and reading out pixel signals from the pixel array section in row units, i.e., all the pixels for the one row simultaneously and in parallel.

In the solid state imaging device, a system for converting an analog pixel signal read out from the pixel array section into digital data with an analog digital converter (an AD converter) and, then, outputting the digital data to the outside may be adopted.

The same applies to the image sensor of the column parallel output type. Various signal output circuits have been devised as a signal output circuit for the image sensor. As an example of a most advanced form of the image sensor, an image sensor of an AD conversion system that includes an AD converter for each of columns and extracts a pixel signal to the outside as digital data has been proposed (see, for example, JP-A-2005-323331).

As the AD conversion system, various systems have been devised from the viewpoints of a circuit size, processing speed (an increase in speed), resolution, and the like. As an example, there is an AD conversion system of a so-called slope integration type or ramp signal comparison type (in this specification, herein after referred to as reference signal comparison type). This is a system for comparing an analog unit signal and a so-called ramp-shaped reference signal (a ramp wave), a gradual value of which changes, for converting the unit signal into digital data, performing count processing in parallel with this comparison processing, and acquiring digital data of the unit signal on the basis of a count value at a point when the comparison processing is completed. JP-A-2005-323331 also discloses an example of an image sensor adopting the AD conversion system of the reference signal comparison type. By combining the AD conversion system of the reference signal comparison type and the column parallel output type, analog outputs from pixels can be AD-converted in column parallel in a low frequency band. Therefore, it can be said that the AD conversion system is suitable for an image sensor that realizes both a high image quality and high speed.

In the pixel signal, more specifically, a difference between a pixel signal level at the time of pixel reset and a pixel signal level at the time when a signal charge is read out is a true signal component. Therefore, even when the AD conversion system of the reference signal comparison type and the column parallel output type are combined to simultaneously convert all pixels in one row into digital data, a mechanism that takes into account the fact that difference processing is necessary is adopted. For example, JP-A-2005-323331 adopts a mechanism for automatically acquiring an AD conversion result of a true signal component, that is, a mechanism for performing a difference processing function simultaneously with the AD conversion, as a final AD conversion output value by making it possible to switch an up-count mode and a down-count mode and using different count modes in AD conversion at a pixel signal level at the time of pixel reset and in AD conversion at a pixel signal level at the time when a signal charge is read out.

SUMMARY OF THE INVENTION

However, in JP-A-2005-323331, a mechanism for count mode switching is necessary to adopt the mechanism for performing a difference processing function simultaneously with the AD conversion. Various mechanisms are conceivable as the mechanism for count mode switching. In general, since it is necessary to arrange the mechanism for count mode switching for each of bits of digital data, a size of a counter area increases. When bit accuracy is increased, naturally, the number of mechanisms for count mode switching also increases. When the AD conversion system of the reference signal comparison type is combined with the column parallel output type, since the mechanisms for count modes witching are necessary for all counter units, the problem of an increase in an area is more serious.

On the other hand, for high quality image creation, special applications, and the like, various kinds of multiply-accumulate processing is applied to pixel signals outputted from pixels. Efficiency of a processing process and a circuit arrangement is considered to be different depending on what kind of mechanism is adopted as a mechanism for the multiply-accumulate processing. For example, a mechanism for applying addition and subtraction to the pixel signals in an analog area and, then, digitizing the pixel signals is not always efficient. In this regard, it is considered to be efficient if arithmetic processing other than the difference processing can be performed simultaneously with the AD conversion. It goes without saying that it is most important to control the increase in the size of the counter area.

Therefore, it is desirable to provide a mechanism for performing, when the AD conversion system of the reference signal comparison type is adopted, multiply-accumulate processing such as a difference processing function and an addition and subtraction processing function simultaneously with AD conversion without causing a problem of an increase in a size of a counter area.

According to an embodiment of the present invention, there is provided a mechanism including a reference-signal generating unit that generates a predetermined level of an analog signal and a reference signal, which gradually changes, for converting the predetermined level into digital data, a comparing unit that compares the reference signal generated by the reference-signal generating unit and a pixel signal, and a count unit that performs count processing in parallel with comparison processing by the comparing unit and stores a count value at a point when the comparison processing is completed to acquire digital data of the predetermined level. In other words, as a mechanism of AD conversion for the analog signal, an AD conversion system of a so-called reference signal comparison type is adopted.

To perform multiply-accumulate processing, the mechanism performs, during count processing for a processing object signal of a subtraction element, the count processing in a period from a point when the processing object signal and a reference signal coincide with each other until a point when the reference signal reaches a predetermined end value and performs, during of count processing for a processing object signal of an addition element, the count processing in a period from a point when the reference signal is a predetermined initial value until a point when the processing object signal and the reference signal coincide with each other.

The mechanism applies the count processing to both the subtraction element and the addition element in an identical mode of anyone of an up-count mode and a down-count mode. During count processing for a following processing object signal, the mechanism starts count processing using a count value stored in count processing for a preceding processing object signal as an initial value.

In addition, the mechanism corrects digital data of a multiply-accumulate result to digital data in which a count value corresponding to a period in which the reference signal reaches the end value from the initial value in the count processing is corrected.

For example, in an example of application of the mechanism to a solid-state imaging device, a processing object signal is an analog pixel signal obtained from a pixel. Levels of the analog pixel signal is a reset level indicating a reference component at the time when pixels are reset and a signal level obtained by adding a true signal component to the reference component. The solid-state imaging device performs the count processing in the up-count mode using the reset level as a subtraction element and using the signal level as an addition element or performs the count processing in the up-count mode using the reset level as an addition element and performs the count processing in the down-count mode using the signal level as the subtraction element. In both the cases, digital data of the true signal component indicated by a difference between the signal level and the reset level can be acquired as a positive value.

The multiply-accumulate includes subtraction processing at least once. "Plural" means at least two. The multiply-accumulate may be applied to three, four, or more processing object signals in order.

For example, there is a differential operation between two processing object signals. When three or more processing object signals are treated, subtraction processing only has to be applied to at least one processing object signal. As an example of the differential operation, there is spatial difference processing for treating plural processing object signals acquired at substantially identical points. By performing the spatial difference processing, it is possible to acquire an image subjected to edge detection, spatial filter processing, and the like as an image subjected to an arithmetic operation. By using the image subjected to an arithmetic operation, it is possible to acquire an edge enhanced image and perform linear detection and pattern recognition.

As another example of the differential operation, there is time difference processing for treating plural processing object signals acquired at substantially different points. By performing the time difference processing, it is possible to acquire an image of a moving portion as an image subjected to an arithmetic operation. By using the image subjected to an arithmetic operation, it is possible to perform moving object detection and moving object tracking.

In some case, a signal outputted from a semiconductor device such as a solid-state imaging device has not only a true signal component but also a reset component and a component such as variation (collectively referred to as reference component) and is outputted as a signal component in a form based on the reference component and added with the true component. In such a case, difference processing is applied to one processing object signal in order to extract the true signal component as a differential signal component.

In performing data correction, during count processing for a first processing object signal, the data correction may be performed by starting the count processing in the count processing unit using, as an initial value, a value corresponding to a count value corresponding to a period in which a reference signal of the processing object signal reaches an end value from an initial value.

Alternatively, after count processing for a last processing object signal is completed, the data correction may be applied to a stored count value by using a value corresponding to a count value corresponding to a period in which a reference signal of the processing object signal reaches an end value from an initial value.

When digital data of a multiply-accumulate result of three or more processing object signals is acquired, only during count processing for a first processing object signal, the count processing can be started in the count processing unit by using, as an initial value, a value corresponding to a count value corresponding to a period in which a reference signal of the processing object signal reaches an end value from an initial value. Therefore, after count processing for a last processing object signal is completed, concerning respective processing object signals of subtraction elements, which are the other processing object signals excluding the first processing object signal, the data correction is applied to a stored count value by respectively using values corresponding to count values corresponding to a period in which reference signals of the processing object signals reach end values from initial values.

The data processing method is applied to the solid-state imaging device, an imaging apparatus, and an electronic device, which have the same structure as a data processing device. The solid-state imaging device may be formed as one-chip or may be a module having an imaging function in which an imaging unit and a signal processing unit or an optical system are collectively packaged. The present invention is applicable not only to the solid-state imaging device but also to an imaging apparatus. In this case, the imaging apparatus has effects same as those of the solid-state imaging device. The imaging apparatus indicates a camera and a portable device having an imaging function. "Imaging" includes not only image capturing during normal camera photographing but also fingerprint detection and the like in a broader sense.

According to an embodiment of the present invention, for each of plural processing object signals, a reference signal for AD conversion and the processing object signal are compared. In parallel with this comparison processing, count processing is performed in an identical mode of any one of a down-count mode and an up-count mode in a predetermined comparison period and a count value at a point when the comparison processing is completed is stored.

In this case, during processing of a following processing object signal among the plural processing object signals, digital data obtained in preceding processing is set as an initial value of count processing. In addition, digital data of a multiply-accumulate result is corrected to digital data in which a count value corresponding a period in which the reference signal reaches an end value from an initial value in count processing for a processing object signal of a subtraction element is corrected. Therefore, it is possible to easily obtain digital data representing a multiply-accumulate result based on the plural processing object signals.

Since AD conversion processing is performed in the comparison processing and the count processing, as a result, a mechanism for simultaneously executing the AD conversion processing and multiply-accumulate processing can be established. In other words, since multiply-accumulate is performed by simultaneously using plural processing object signals while AD-converting a processing object signal by operating a reference signal for AD conversion, it is possible to efficiently perform AD conversion and arithmetic processing.

BRIEF DESCRIPTION OF THE DRAWINGS

FIG. 10 is a diagram showing an example of a circuit configuration of a count-phase switching unit;

DESCRIPTION OF THE PREFERRED EMBODIMENTS

Embodiments of the present invention will be herein after explained in detail with reference to the accompanying drawings. In an example explained below, a CMOS solid-state imaging device, which is an example of a solid-state imaging device of an X-Y address type, is used as a device. It is assumed that, in the CMOS solid-state imaging device, all pixels include NMOSs.

However, this is only an example and an object device is not limited to a solid-state imaging device of a MOS type. All the embodiments described below can be applied in the same manner to all semiconductor devices for detecting a physical quantity distribution in which plural unit components having sensitivity to electromagnetic waves inputted from the outside such as light and radiations are arrayed in a line shape or a matrix shape.

Overview of a Solid-State Imaging Device: First Embodiment

Figure 1A:
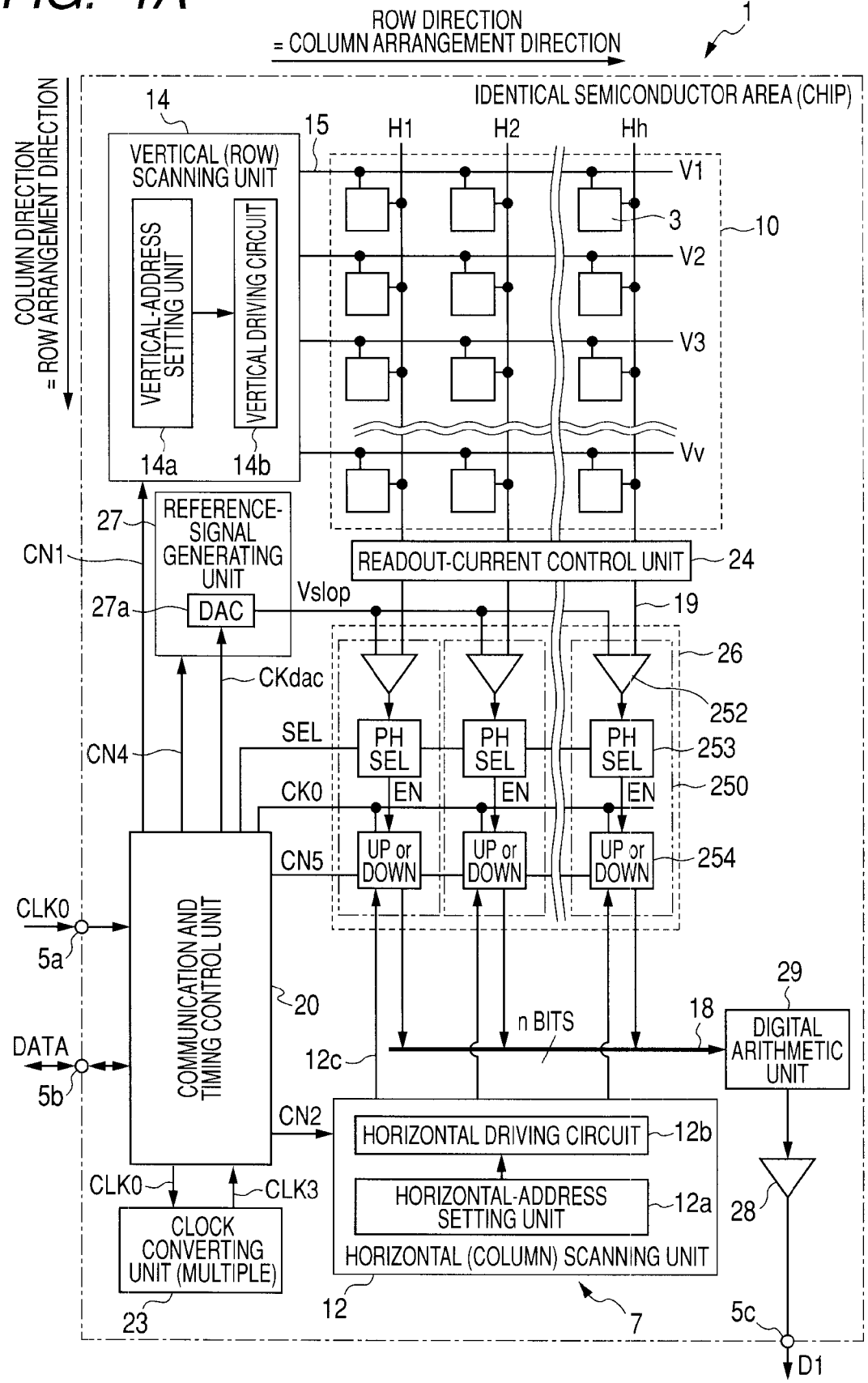
FIG. 1A is a schematic diagram of a CMOS solid-state imaging device as a solid-state imaging device according to a first embodiment of the present invention.

FIG. 1A is a schematic diagram of a CMOS solid-state imaging device (a CMOS image sensor) as a solid-state imaging device according to a first embodiment of the present invention.

A solid-state imaging device 1 includes a pixel unit (a two-dimensional matrix shape) in which plural pixels including light receiving elements (an example of a charge generating unit) that output signals corresponding to an incident light amount are arrayed in rows and columns. Signal outputs from the respective pixels are voltage signals. CDS (Correlated Double Sampling) processing function units, digital conversion units (ADCs; Analog Digital Converters), and the like are provided in column parallel in the solid-state imaging device 1.

"The CDS processing function units and the digital conversion units are provided in column parallel" means that plural CDS processing function unit and digital conversion units are provided substantially in parallel with vertical signal lines (an example of column signal lines) 19 in vertical columns.

The plural functional units may be arranged only on one end edge side (an output side arranged on a lower side in the figure) in a column direction with respect to a pixel array unit 10 when the device is viewed in plan. Alternatively, the plural functional units may be dividedly arranged on one end edge side (an output side arranged on a lower side of the figure) and the other end edge side (an upper side in the figure) on the opposite side of one end edge side in a column direction with respect to the pixel array unit 10. In the latter case, it is desirable to also dividedly arrange horizontal scanning units that perform readout scanning in a row direction (horizontal scanning) on the respective end edge sides such that the horizontal scanning units can operate independently from each other.

For example, as a typical example of a solid-state imaging device in which CDS processing function units and digital conversion units are provided in column parallel, there is a solid-state imaging device of a column type in which CDS processing function units, analog signal processing units, and digital conversion units are provided for respective vertical columns at the portion called column area which is provided on an output side of an imaging unit and read out to an output side in order, and the vertical columns, the CDS processing function units, the digital conversion units, and the like are connected in one to one relation. The solid-state imaging device is not limited to the column type (a column parallel type). It is also possible to adopt a form for allocating one CDS processing function unit and one digital conversion unit to adjacent plural (e.g., two) vertical signal lines 19 (vertical columns) and a form for allocating one CDS processing function unit and one digital conversion unit to N vertical signal lines 19 (vertical columns) at intervals of N lines (N is a positive integer; N−1 vertical signal lines 19 are arranged between CDS processing function units and between digital conversion units).

In all the forms except the column type, the plural vertical signal lines 19 (vertical columns) use one CDS processing function unit and one digital conversion unit in common. Therefore, a switching circuit (a switch) that supplies pixel signals for plural columns supplied from the pixel array unit 10 side to one CDS processing function unit and one digital conversion unit is provided. Depending on processing at a post stage, it is necessary to separately provide a memory that stores an output signal.

In any case, by adopting, for example, the form for allocating one CDS processing function unit and one digital conversion unit to the plural vertical signal lines 19 (vertical columns), signal processing for respective pixel signals is performed after the pixel signals are read out in pixel row units. Therefore, compared with a form for performing the same signal processing in respective unit pixels, it is possible to simplify the structure in the respective unit pixels and realize an increase in the number of pixels, a reduction in size, and a reduction in cost of an image sensor.

Pixel signals for one row can be simultaneously processed in parallel in the plural signal processing units arranged in column parallel. Therefore, compared with a case in which processing is performed in one CDS processing function unit and one digital conversion unit on an output circuit side or the outside of the device, it is possible to cause the signal processing units to operate at low speed. This is advantageous in terms of power consumption, band performance, noise, and the like. In other words, when power consumption, band performance, and the like are set the same, high-speed operation of the entire sensor is possible.

In the case of the structure of the column type, since it is possible to cause the signal processing units to operate at low speed, there is an advantage in terms of power consumption, band performance, noise, and the like. In addition, there is also an advantage that a switching circuit (a switch) is unnecessary. In the embodiments described below, the solid-state imaging device of the column type is explained unless specifically noted otherwise.

As shown in FIG. 1A, the solid-state imaging device 1 according to this embodiment includes the pixel array unit 10 also referred to as a pixel unit, an imaging unit, and the like in which plural unit pixels 3 are arrayed in rows and columns, a driving control unit 7 provided on an outer side of the pixel array unit 10, a readout-current control unit 24 that supplies an operation current (a readout current) for reading out a pixel signal to unit pixels 3 of the pixel array unit 10, a column processing unit 26 that has column AD circuits 250 arranged for the respective vertical columns, a reference-signal generating unit 27 that supplies a reference signal Vslop for AD conversion to the column processing unit 26, and output circuits 28. These functional units are provided on an identical semiconductor substrate.

A digital arithmetic unit 29 may be provided at a pre-stage of the output circuit 28 when necessary. "When necessary" means that multiply-accumulate processing for plural pixels for plural rows is performed in the column AD circuits 250. The digital arithmetic unit 29 includes a function of correcting an initial value (described later in detail) in subjecting data in plural rows to multiply-accumulate in the column AD circuits 250 basically in a vertical direction. The multiply-accumulate processing may be any one of processing of only addition of plural pixels, processing of only subtraction of plural pixels, and processing as a combination of addition and subtraction of plural pixels. Gain elements are not limited to be identical in AD conversion processing for the respective pixels and may be different (e.g., a tilt of a reference signal Vslop is changed).

When an AD conversion system of a reference signal comparison type is adopted, it is also conceivable to provide the reference-signal generating unit 27 in column parallel (for each of pixel rows). For example, comparators and reference signal generators are provided on respective pixel rows and, on the basis of a comparison result of a comparator in a column, values of reference signals are changed in order by the reference signal generator on the column. However, this increases a circuit size and power consumption. Therefore, in this embodiment, the reference-signal generating unit 27 is used in common for all the columns, the column AD circuits 250 in the respective pixel rows share the reference signal Vslop generated by the reference-signal generating unit 27, and, in the respective pixel rows, AD conversion is performed by storing a counter value as AD conversion results of the respective pixel rows when the comparison processing is completed.

The reference signal Vslop only has to have a waveform that changes linearly as a whole at a certain tilt. The reference signal Vslop may change in a gentle slope shape or may sequentially change stepwise.

The column AD circuit 250 according to this embodiment has functions of an AD conversion unit that converts a reset level Srst, which is a reference level of a pixel signal So, and a signal level Ssig into digital data independently from each other and a difference processing unit that acquires digital data Dsig of a signal component Vsig indicated by a difference between the reset level Srst and the signal level Ssig by executing difference processing between an AD conversion result of the reset level Srst and an AD conversion result of the signal level Ssig.

The driving control unit 7 has a control circuit function for reading out signals of the pixel array unit 10 in order. For example, the driving control unit 7 includes a horizontal scanning unit (a column scanning circuit) 12 including a horizontal-address setting unit 12a and a horizontal driving unit 12b that control a column address and column scanning, a vertical scanning unit (a row scanning circuit) 14 including a vertical-address setting unit 14a and a vertical driving unit 14b that control a row address and row scanning, and a communication and timing control unit 20 that has a function of, for example, generating an internal clock.

In the figure, as indicated by a dotted line near the communication and timing control unit 20, a clock converting unit 23 that is an example of a high-speed clock generating unit and generates a pulse of a clock frequency higher than an inputted clock frequency may be provided. The communication and timing control unit 20 generates an internal clock on the basis of an input clock (a master clock) CLK0 inputted via a terminal 5a and a high-speed clock generated by the clock converting unit 23.

It is possible to cause AD conversion processing and the like to operate at high speed by using a signal generated from the high-speed clock generated by the clock converting unit 23. It is possible to perform motion extraction and compression processing, which need high-speed calculation, using the high-speed clock. It is also possible to convert parallel data outputted from the column processing unit 26 into serial data and output video data D1 to the outside of the device. Consequently, it is possible to output AD-converted digital data in a high-speed operation using terminals smaller in number than bits of the digital data.

The clock converting unit 23 incorporates a multiply circuit that generates a pulse of a clock frequency higher than an inputted clock frequency. The clock converting unit 23 receives a low-speed clock CLK2 from the communication and timing control unit 20 and generates a clock of a frequency twice or more higher than the low-speed clock CLK2 on the basis of the low-speed clock CLK2. As the multiply circuit of the clock converting unit 23, when k1 is a multiple of a frequency of the low-speed clock CLK2, k1 multiply circuits only have to be provided. It is possible to use various well-know circuits.

In FIG. 1A, a part of rows and columns are omitted for simplification of illustration. However, actually, several tens to several thousands unit pixels 3 are arranged in respective pixel rows and respective pixel columns. Each of the unit pixels 3 typically includes a photodiode as a light-receiving element (a charge generating unit), which is an example of a detecting unit, and an in-pixel amplifier (an example of the pixel-signal generating unit) that has a semiconductor element (e.g., transistor) for amplification.

The in-pixel amplifier only has to be capable of outputting a signal charge, which is generated and accumulated by the charge generating unit of the unit pixel 3, as an electric signal. It is possible to adopt various kinds of structure for the in-pixel amplifier. In general, a floating diffusion amplifier is used. As an example, it is possible to use an in-pixel amplifier configured by general-purpose four transistors as CMOS sensors including, with respect to the charge generating unit, a transfer unit that has a readout selecting transistor as an example of a charge readout unit (a transfer gate unit/a readout gate unit), an initializing unit that has a reset transistor as an example of a reset gate unit, a vertical selection transistor, and an amplification transistor of source follower structure as an example of a detection element that detects a potential change in floating diffusion (also referred to as a floating node).

Alternatively, it is also possible to use an in-pixel amplifier configured by three transistors including an amplification transistor connected to a drain line (DRN) for amplifying a signal voltage corresponding to a signal charge generated by the charge generating unit, a reset transistor for resetting the charge generating unit, and are ad out selection transistor (a transfer gate unit) scanned from a vertical shift resistor via a transfer wire (TRF).

In the solid-state imaging device 1, the pixel array unit 10 can be adapted to color imaging by using a color separation filter. The pixel array unit 10 is adapted to imaging of color images by providing, for example, in a so-called Bayer array, any one of color filters of a color separation filter including a combination of color filters of plural colors for imaging a color image on a light-receiving surface, on which electromagnetic waves (in this example, light) of the respective charge-generating units (photodiodes, etc.) are made incident, in the pixel array unit 10.

The pixel units 3 are connected to the vertical scanning unit 14 through row control lines 15 for row selection and connected to the column processing unit 26, in which the column AD circuits 250 are provided for the respective vertical columns, through the vertical signal lines 19. The row control lines 15 indicate all wires that enter the pixels from the vertical scanning unit 14.

The horizontal scanning unit 12 has a function of a readout scanning unit that reads out a count value to horizontal signal lines 18 from the column processing unit 26.

Respective elements of the driving control unit 7 such as the horizontal scanning unit 12 and the vertical scanning unit 14 are integrally formed with a semiconductor area of single crystal silicon or the like using a technique same as a semiconductor integrated circuit manufacturing technique. The elements are configured as a solid-state imaging device, which is an example of a semiconductor system, together with the pixel array unit 10.

The respective functional units are configured to form a part of the solid-state imaging device 1 according to this embodiment as a so-called one-chip device (provided on an identical semiconductor substrate) integrally formed in a semiconductor area of single crystal silicon or the like, i.e., as a CMOS image sensor, which is an example of a semiconductor system, using the technique same as the semiconductor integrate circuit manufacturing technique.

The solid-state imaging device 1 may be formed as one chip in which the respective units are integrally formed in the semiconductor area in this way. Although not shown in the figure, the solid-state imaging device 1 may be a module having an imaging function obtained by packaging optical systems such as an imaging lens, an optical low-pass filter, and an infrared ray filter besides the various signal processing units such as the pixel array unit 10, the driving control unit 7, and the column processing unit 26.

The horizontal scanning unit 12 and the vertical scanning unit 14 include, for example, decoders and start a shift operation (scanning) in response to control signals CN1 and CN2 given from the communication and timing control unit 20. Therefore, for example, the row control lines 15 include various pulse signals for driving the unit pixels 3 (e.g., a pixel reset pulse RST for defining an initialization control potential, a transfer pulse TRG for defining a transfer control potential, and vertical selection pulse VSEL).

Although not shown in the figure, the communication and timing control unit 20 includes two function blocks. One function block is a function block of a timing generator TG (an example of a readout address control device) that supplies a clock necessary for operations of the respective units and a pulse signal of predetermined timing. The other function block is a function block of a communication interface that receives a master clock CLK0 supplied from a main control unit on the outside through the terminal 5a, receives data instructing an operation mode and the like supplied from the main control unit on the outside through a terminal 5b, and outputs data including information on the solid-state imaging device 1 to the main control unit on the outside.

For example, the communication and timing control unit 20 outputs a horizontal address signal to the horizontal-address setting unit 12a and outputs a vertical address signal to the vertical-address setting unit 14a. The address setting units 12a and 14a receive the horizontal address signal and the vertical address signal and select rows or columns corresponding thereto, respectively.

The unit pixels 3 are arranged in a two-dimensional matrix shape. Therefore, (vertical) scan reading for accessing the unit pixels 3 and capturing an analog pixel signal, which is generated by the pixel-signal generating unit 5 and outputted in a column direction through the vertical signal line 19, in row units (in column parallel) is performed. Then, (horizontal) scan reading for accessing the unit pixels 3 in a row direction, which is a vertical column arrangement direction, and reading out a pixel signal (in this example, digitized pixel data) to an output side is performed. It is desirable to realize an increase in speed of readout of the pixel signal and the pixel data in this way. It goes without saying that it is possible to perform not only the scan reading but also random access for reading out only necessary information of the unit pixels 3 by directly designating addresses of the unit pixels 3 from which a pixel signal or pixel data is desired to be read out.

The communication and timing control unit 20 supplies a clock CLK1 of a frequency same as that of the input clock (the master clock) CLK0 inputted via the terminal 5a and a clock obtained by dividing the frequency of the clock CLK1 by two or a low-speed clock obtained by further dividing the clock to, for example, the horizontal scanning unit 12, the vertical scanning unit 14, and the column processing unit 26. The clock obtained by dividing the frequency of the clock CLK1 by two and the clock of the frequency lower than that are collectively referred to as low-speed clock CLK2 as well.

The vertical scanning unit 14 selects a row of the pixel array unit 10 and supplies a necessary pulse to the row. The vertical scanning unit 14 includes, for example, the vertical-address setting unit 14a that defines a readout row in the vertical direction (selects a row of the pixel array unit 10) and the vertical driving unit 14b that supplies a pulse to the row control line 15 corresponding to the unit pixel 3 on a readout address (in the row direction) defined by the vertical-address setting unit 14a and drives the row control line 15. The vertical-address setting unit 14a selects a row for an electronic shutter and the like besides a row from which a signal is read out (a readout row: also referred to as selection row and signal output row).

The horizontal scanning unit 12 selects the column AD circuits 250 of the column processing unit 26 in order in synchronization with the low-speed clock CLK2 and guides signals of the column AD circuits 250 to the horizontal signal lines (horizontal output lines) 18. For example, the horizontal scanning unit 12 includes the horizontal-address setting unit 12a that defines a readout column in the horizontal direction (selects the respective column AD circuits 250 in the column processing unit 26) and the horizontal driving unit 12b that guides respective signals of the column processing unit 26 to the horizontal signal lines 18 in accordance with the readout address defined by the horizontal-address setting unit 12a. The number of horizontal signal lines 18 is equal to the number of bits n (n is a positive integer) treated by the column AD circuits 250. For example, when the number of bits is 10 (=n), ten horizontal signal lines 18 are arranged in association with the number of bits.

In the solid-state imaging device 1 having such structure, pixel signals outputted from the unit pixels 3 are supplied, for each of the vertical rows, to the column AD circuits 250 of the column processing unit 26 through the vertical signal lines 19.

Each of the column AD circuits 250 of the column processing unit 26 receives an analog signal So of the unit pixel 3 of a column corresponding thereto and processes the analog signal So. For example, the column AD circuit 250 has an ADC (Analog Digital Converter) circuit that converts the analog signal So into a 10-bit digital signal using, for example, the low-speed clock CLK2.

As the AD conversion processing in the column processing unit 26, a method of AD-converting, for each of the rows in parallel, analog signals So stored in parallel in row units using the column AD circuits 250 provided for the respective columns. In this case, a method of AD conversion of a reference signal comparison type is used. This method has a characteristic that, since AD converters can be realized with the simple structure, a circuit size does not increase even if the AD converters are provided in parallel.

In the AD conversion of the reference signal comparison type, an analog processing object signal is converted into a digital signal on the basis of time from the start of conversion (the start of comparison processing) until the end of conversion (the end of the comparison processing). In the mechanism disclosed in JP-A-2005-323331, in both two times of processing, the start of conversion (the start of the comparison processing) is set as a point of start of a change in the reference signal Vslop and the end of conversion (the end of the comparison processing) is set as a point when the reference signal Vslop and a processing object signal voltage coincide with each other.

On the other hand, in this embodiment, in any one of the two times of processing, the start of conversion (the start of the comparison processing) is set as a point of start of a change in the reference signal Vslop and the end of conversion (the end of the comparison processing) is set as a point when the reference signal Vslop and the processing object signal voltage coincide with each other. However, in the other of the two times of processing, the start of conversion (the start of the comparison processing) is set as a point when the reference signal Vslop and a processing object signal voltage coincide with each other and the end of conversion (the end of the comparison processing) is set at a point when a desired count number in the processing is completed (typically, a point when a maximum AD conversion period comes).

As a mechanism for the conversion, in principle, the reference signal Vslop of a ramp shape is supplied to a comparator (a voltage comparator), count in a clock signal is started, and analog pixel signals inputted through the vertical signal lines 19 are compared with the reference signal Vslop. Consequently, the AD conversion is performed by counting the number of clocks in a designated count period.

Further, in this case, by contriving a circuit configuration, it is possible to perform, together with the AD conversion, processing (equivalent to so-called CDS processing) for calculating a difference between a signal level immediately after pixel reset (referred to as noise level or reset level) and a signal level (corresponding to an amount of received light). Consequently, it is possible to remove a noise signal component called fixed pattern noise (FPN) and reset noise.

Details of the reference-signal generating unit and the column AD circuits The reference-signal generating unit 27 includes a DA converter (DAC; Digital Analog Converter) 27a. The reference-signal generating unit 27 generates a stepwise sawtooth wave (a ramp waveform; herein after also referred to as reference signal Vslop) from an initial value indicated by control data CN4 from the communication and timing control unit 20 in synchronization with a count clock CKdac. The reference-signal generating unit 27 supplies the reference signal Vslop of the generated stepwise sawtooth wave to the respective column AD circuits 250 of the column processing unit 26 through the reference-signal control unit 25 as a reference voltage for AD conversion (an ADC reference signal). Although not shown in the figure, it is desirable to provide a filter for noise prevention. The count clock CKdac may be identical with the count clock CK0.

When the reference signal Vslop is generated with respect to, for example, a high-speed clock generated on the basis of a multiply clock generated by a multiplying circuit, the reference signal Vslop can be changed at higher speed than that generated on the basis of the master clock CLK0 inputted through the terminal 5a.

The control data CN4 supplied from the communication and timing control unit 20 to the DA converter 27a of the reference-signal generating unit 27 includes information for equalizing a rate of change of digital data with respect to time such that the reference signal Vslop in every comparison processing basically has the same tilt (rate of change). Specifically, a count value is changed by 1 at every unit time in synchronization with the count clock CKdac and converted into a voltage signal by a DA converter of a current addition type.

The column AD circuits 250 include voltage comparing units (comparators) 252 that compare the reference signal Vslop generated by the DA converter 27a of the reference-signal generating unit 27 and analog pixel signals obtained through the vertical signal lines 19 (H1, H2, ..., Hh) from the unit pixels 3 for the respective row control lines 15 (V1, V2, V3, ..., Vv) and counter units 254 that count time until completion of comparison processing by the voltage comparing units 252 and hold a result of the counting. The column AD circuits 250 have an n-bit AD conversion function.

As a major difference from the mechanism disclosed in JP-A-2005-323331, count-phase switching units (PH SEL) 253 that control a period of count processing in the counter units 254 are provided between the voltage comparing units 252 and the counter units 254. A count period control signal SEL for controlling a count period is supplied to the count-phase switching units 253 from the communication and timing control unit 20. Comparison pulses COMP are supplied to the count-phase switching units 253 from the voltage comparing units 252.

The count-phase switching units 253 logically invert the comparison pulses COMP from the voltage comparing units 252 on the basis of the count period control signal SEL and pass the comparison pulses COMP to the counter units 254 as count enable signals EN (in an anti-phase). Alternatively, the count-phase switching units 253 directly pass the comparison pulses COMP to the counter units 254 as count enable signals EN (in an in-phase). The count-phase switching units 253 are an example of count-period control units that determine a count period on the basis of the comparison pulses COMP, which are comparison results of the voltage comparing units 252, and the count period control signal SEL.

For example, as the count-phase switching units 253, EX-OR (exclusive OR) gates are used. The comparison pulses COMP are inputted to one input terminals thereof and the count period control signal SEL is inputted to the other input terminals thereof. In this case, when the count period control signal SEL is at an H level, the EX-OR gates logically invert the comparison pulses COMP into a count enable signal EN.

When the count period control signal SEL is at an L level, the EX-OR gates directly set the comparison pulse COMP as the count enable signal EN.

As it is understood from this operation, the count-phase switching units 253 only have to have a function of deciding whether the comparison pulses COMP should be logically inverted between the voltage comparing units 252 and the counter units 254. Therefore, it is possible to provide the count-phase switching units 253 in an area smaller than that of components such as selectors used for respective bits that are necessary in providing an up-down count function in the counter units 254.

The reference signal Vslop is supplied from the DA converter 27a in common to the voltage comparing units 252 arranged in the respective columns. The respective voltage comparing units 252 apply comparison processing to a pixel signal voltage Vx, which is processed by the voltage comparing units 252, using the common reference signal Vslop. The counter units 254 use outputs of the count-phase switching units 253 as the count enable signals EN and perform count processing on the basis of the count clock CK0 when the count enable signals EN are at the H level. After the count processing is finished, the counter units 254 stores count results.

The communication and timing control unit 20 has a function of a control unit that switches, according to which of a reset level Vrst and a signal component Vsig of a pixel signal the voltage comparing units 252 apply comparison processing, a count period of count processing in the counter units 254 by controlling the count period control signal SEL supplied to the count-phase switching units 253.

Besides the count period control signal SEL, the communication and timing control unit 20 inputs, to the count-phase switching units 253 and the counter units 254 of the respective column AD circuits 250, a control signal CN5 for indicating in which of a down-count mode and an up-count mode the counter units 254 operate in two times of count processing and indicating other control information for setting of an initial value Dini in one time of count processing, and reset processing, and the like.

The stepwise reference signal Vslop generated by the reference-signal generating unit 27 is inputted to one input terminal RAMP of the voltage comparing unit 252 in common with input terminals RAMP of the other voltage comparing units 252. The vertical signal lines 19 of the vertical columns corresponding to the voltage comparing units 252, respectively, are connected to the other input terminals and pixel signal voltage from the pixel array unit 10 are inputted to the other input terminals, respectively. Output signals (comparison pulses COMP) of the voltage comparing units 252 are supplied to the count-phase switching units 253.

A count clock CK0 is inputted to a clock terminal CK of the counter unit 254 in common with clock terminals CK of the other counter units 254 from the communication and timing control unit 20. Although the structure of the counter units 254 is not shown in the figure, the counter units 254 can be realized by changing a wiring form of data storing units formed by latches to a synchronous counter form. The counter units 254 perform internal count with an input of one count clock CK0. As the count clock CK0, like the reference signal Vslop, a multiply clock (a high-speed clock) generated by the multiplying circuit can be used. In this case, resolution can be set higher than that obtained by using the master clock CLK0 inputted via the terminal 5a.

The counter units 254 only have to operate in one of a down-count operation and an up-count operation in two times of count processing for acquiring the digital data Dsig of the signal component Vsig of one pixel. The counter units 254 only have to be any one of up-counters or down-counters corresponding to the operation. However, in principle, as a form of use, an up-down counter that can switch the down-count operation and the up-count operation may be used to cause the counter units 254 to operate in any one of the down-count operation and the up-count operation. However, usually, the up-down counter needs a circuit configuration for the mode switching and a circuit size thereof is large compared with a configuration corresponding to a single count mode of an up-counter or a down-counter. Therefore, the up-down counter is not adopted in this embodiment.

As the counter units 254 according to this embodiment, it is preferable to use asynchronous counters from which count output values are outputted not in synchronization with the count clock CK0. Basically, synchronous counters can be used. However, in the case of the synchronous counters, operations of all flip-flops (counter basic elements) are limited by the count clock CK0. Therefore, when a higher-frequency operation is requested, it is preferable to use, as the counter units 254, the asynchronous counters suitable for a high-speed operation because an operation limit frequency thereof depends only on a limit frequency of a first flip-flop (counter basic element).

A control pulse is inputted to the counter units 254 from the horizontal scanning unit 12 through control lines 12c. The counter units 254 have a latch function for storing a count result and store counter output values until an instruction by the control pulse is received through the control lines 12c. On output sides of the respective column AD circuits 250, in the structure according to the first embodiment, outputs of the counter units 254 are directly connected to the horizontal signal lines 18.

In such structure, the column AD circuits 250 perform count operations in a predetermined pixel signal readout period and output count results at predetermined timing. In other words, the voltage comparing units 252 compare the reference signal Vslop from the reference-signal generating unit 27 and the pixel signal voltage Vx inputted through the vertical signal lines 19. When both the voltages are the same, the comparison pulses COMP (comparate outputs) of the voltage comparing units 252 are inverted. For example, the voltage comparing unit 252 sets an H level of a power supply potential or the like as an inactive state and, when the pixel signal voltage Vx and the reference signal Vslop coincide with each other, shifts to an L level (an active state).

The count-phase switching units 253 determine a count processing period in the counter units 254 on the basis of the comparison pulses COMP, which are comparison results of the voltage comparing units 252, and the count period control signal SEL from the communication and timing control unit 20 and indicate the count processing period to the counter units 254. The counter units 254 performs count processing in the down-count mode or the up-count mode in the count processing period designated by the count-phase switching units 253 based on the count period control signal SEL and latch (store) a count number in the count processing period as pixel data to complete the AD conversion.

Thereafter, the counter units 254 output, on the basis of a shift operation according to a horizontal selection signal CH(i) inputted from the horizontal scanning unit 12 through the control lines 12c at predetermined timing, the stored pixel data in order to the outside of the column processing unit 26 and the outside of the chip including the pixel array unit 10 from output terminals 5c.

Other various signal processing circuits may be included in the components of the solid-state imaging device 1, although not shown in the figure because the signal processing circuits are not directly related to the explanation of this embodiment.

Overview of a Solid-state Imaging Device: Second Embodiment

Figure 1B:
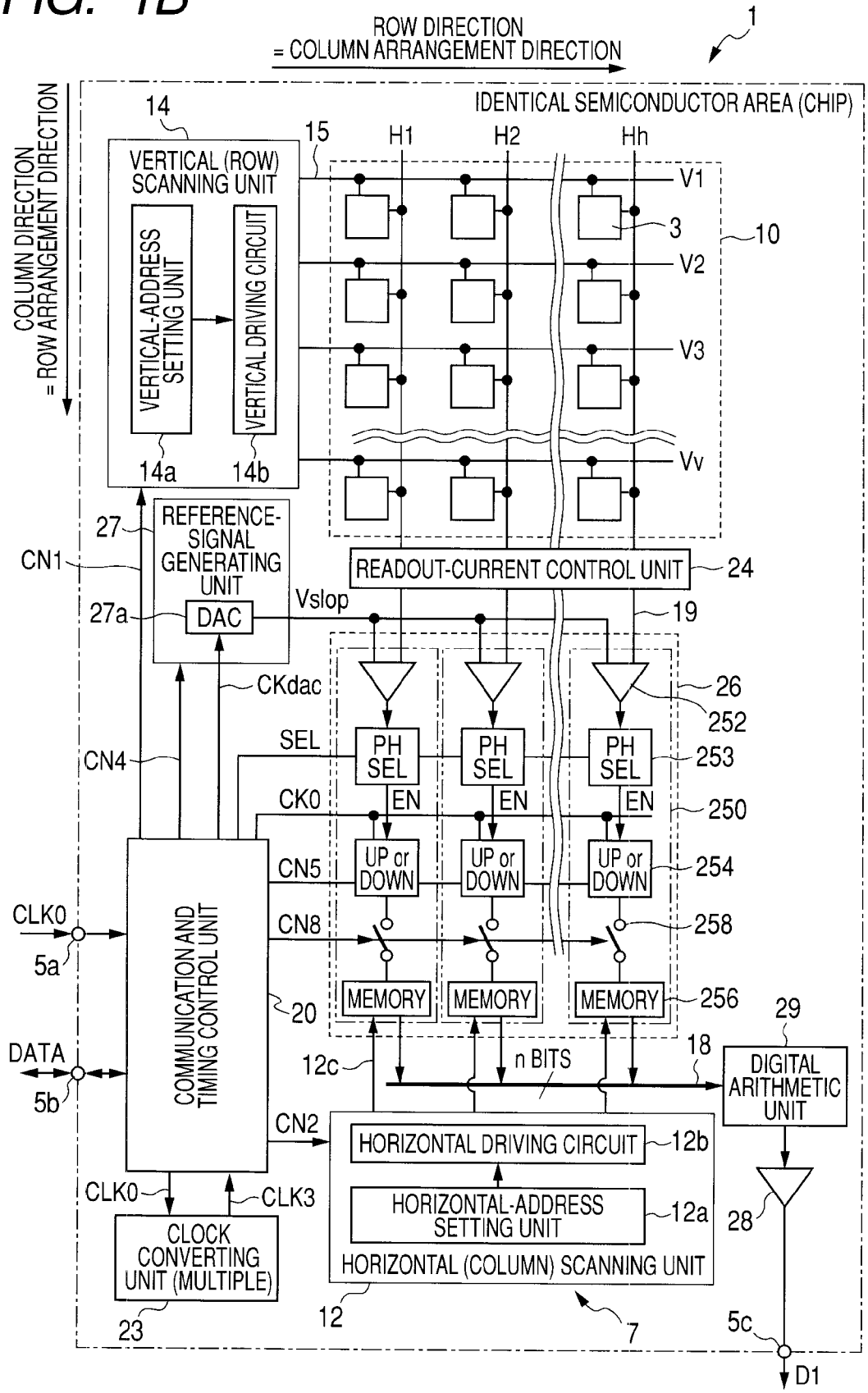
FIG. 1B is a schematic diagram of a CMOS solid-state imaging device as a solid-state imaging device according to a second embodiment of the present invention.

FIG. 1B is a diagram showing a schematic structure of a CMOS solid-state imaging device (a CMOS image sensor) as a solid-state imaging device according to a second embodiment of the present invention. In the solid-state imaging device 1 according to the second embodiment, a configuration of the column AD circuits 250 is modified with respect to the solid-state imaging device 1 according to the first embodiment.

The column AD circuits 250 according to the second embodiment include, at post stages of the counter units 254, data storing units 256 as n-bit memory devices that store count results stored by the counter units 254. The column AD circuits 250 also include switches 258 arranged between the counter units 254 and the data storing units 256.

When the data storing units 256 are provided, a memory transfer instruction pulse CN8 is supplied to the switch 258 at the predetermined timing, in common with the switches 258 in other vertical columns from the communication and timing control unit 20. When the memory transfer instruction pulse CN8 is supplied to the switches 258, the switches 258 transfer count values of the counter units 254 corresponding thereto to the data storing units 256. The data storing units 256 store the transferred count values.

A mechanism for causing the data storing units 256 to store the count values of the counter units 254 at the predetermined timing is not limited to the arrangement of the switches 258 between the counter units 254 and the data storing units 256. For example, the mechanism can be realized by controlling output enable of the counter units 254 with the memory transfer instruction pulse CN8 while directly connecting the counter units 254 and the data storing units 256. Further, the mechanism can be realized by using the memory transfer instruction pulse CN8 as a latch clock for determining data capturing timing of the data storing units 256.

A control pulse is inputted to the data storing units 256 from the horizontal scanning unit 12 through the control lines 12c. The data storing unit 256 store count values captured from the counter units 254 until an instruction by the control pulse is received through the control lines 12c.

The horizontal scanning unit 12 has a function of a readout scanning unit that reads out the count values stored by the respective data storing units 256 in parallel with the processing performed by the voltage comparing units 252 and the counter units 254 of the column processing unit 26.

Outputs of the data storing units 256 are connected to the horizontal signal lines 18. The horizontal signal lines 18 have signal lines for n-bit width, which is a bit width of the column AD circuits 250, and are connected to the output circuits 28 through n sense circuits corresponding to not-shown output lines thereof.

In particular, when the data storing units 256 are provided, the count results stored by the counter units 254 can be transferred to the data storing units 256. Therefore, it is possible to control a count operation of the counter units 254, i.e., AD conversion processing, and a readout operation for reading out the count results to the horizontal signal lines 18 independently from each other. It is possible to realize a so-called pipeline operation for performing the AD conversion processing and a readout operation for reading out signals to the outside in parallel with each other.

Figure 2:
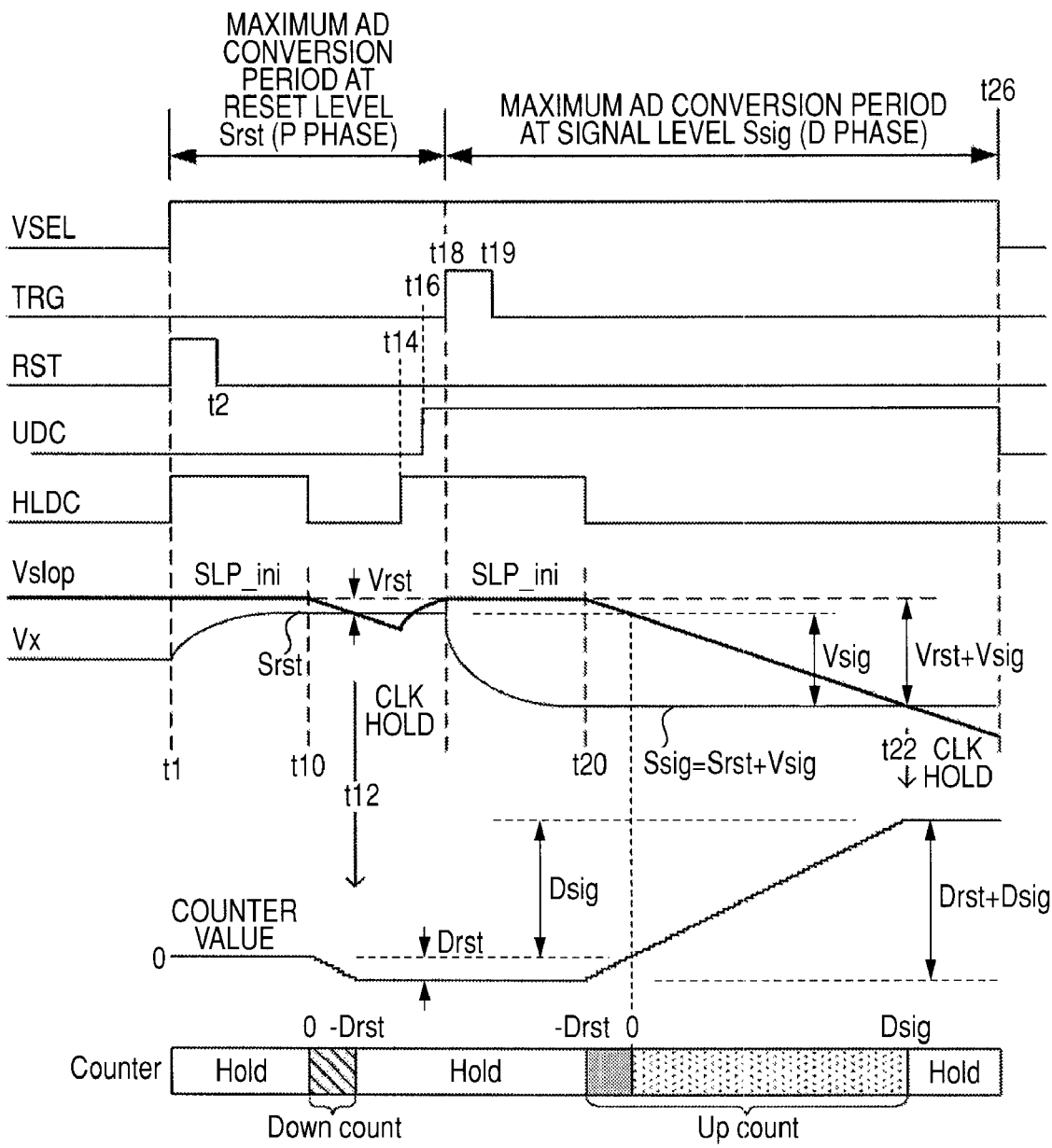
FIG. 2 is a timing chart for explaining an operation of a comparative example with respect to signal acquisition difference processing that is a basic operation in a column AD circuit of a solid-state imaging device 1 according to the first embodiment shown in FIG. 1A.

Operation of the Solid-state Imaging Device: Operation According to a Comparative Example FIG. 2 is a timing chart for explaining an operation according to a comparative example with respect to signal acquisition difference processing that is a basic operation in the column AD circuits 250 of the solid-state imaging device 1 shown in FIG. 1A. To facilitate understanding of characteristics of column AD conversion processing to which the AD conversion processing of the reference signal comparison type according to this embodiment is applied, a general processing method of the AD conversion processing of the reference signal comparison typed is closed in JP-A-2005-323331 is described. Then, concerning the characteristics of the processing according to this embodiment, an operation principle and a specific embodiment are explained.

As a mechanism for converting analog pixel signals detected by the respective unit pixels 3 of the pixel array unit 10 into digital signals, for example, a method of obtaining count values of pixel signal levels corresponding to levels of reference components and signal components is adopted. In the method, the count values are obtained by finding a point where the reference signal Vslop of a ramp waveform shape that falls at a predetermined tilt (or falls stepwise) and voltages of the reference components and the signal components in the pixel signals from the unit pixels 3 coincide with each other and counting, with a count clock, time from a point when the reference signal Vslop used in this comparison processing is generated (when a change in the reference signal Vslop starts) to a point when electric signals corresponding to the reference components and the signal components in the pixel signals and the reference signal Vslop coincide with each other.

The analog pixel signal voltage Vx read out to the vertical signal line 19 is compared with the reference signal Vslop in the voltage comparing unit 252 of the column AD circuit 250 arranged for each of the columns. The counter unit 254 arranged for each of the columns in the same manner as the voltage comparing unit 252 is actuated in advance. The pixel signal voltage Vx of the vertical signal line 19 is converted into digital data by changing a certain potential of the reference signal Vslop and the counter unit 254 while associating the potential and the counter unit 254 in a one to one relation. Here, the change in the reference signal Vslop converts a voltage change into a time change. The pixel signal voltage Vx is converted into digital data by counting the time with the counter unit 254 while quantizing the time at a certain period (clock). Assuming that the reference signal Vslop changes by ΔV in certain time Δt, when the counter unit 254 is actuated at a period of Δt, a counter value at the time when the reference signal Vslop changes by N×ΔV is N.

In the pixel signal So (the pixel signal voltage Vx) outputted from the vertical signal line 19, in time series, the signal level Ssig appears after the reset level Srst including noise of a pixel signal as a reference level. When P-phase processing is applied to the reference level (a reset level Srst; in practice, equivalent to the reset level Vrst), D-phase processing is processing for the signal level Ssig obtained by adding the signal component Vsig to the reset level Srst.

Although detailed explanation is omitted, in the AD conversion processing disclosed in JP-A-2005-323331, first, at the first processing, i.e., in a processing period of a pre-charge phase (which may be abbreviated as P phase) that is an AD conversion period for the reset level Srst, the communication and timing control unit 20 first sets a reset control signal CLR to active H to reset count values of the respective flip-flops of the counter unit 254 to an initial value "0" and sets the counter unit 254 in the down-count mode (t1).

At this point, the communication and timing control unit 20 sets a data storage control pulse HLDC to active H and sets a count mode control signal UDC at a low level (i.e., in the down-count mode). In addition, at this point, the unit pixels 3 are reset to a reset potential (t1 to t2). The reset potential is outputted to the vertical signal line 19 as the pixel signal So. Consequently, the reset level Srst appears on the vertical signal line 19 as the pixel signal voltage Vx.

The reset level Srst on the vertical signal lines 19 (H1, H2, . . . ) converges and stabilizes. The communication and timing control unit 20 uses a data storage control pulse HLDC as the control data CN4 and sets the data storage control pulse HLDC inactive L (t10) such that the reference signal Vslop starts to change simultaneously with the start of a count operation in the counter unit 254. In response, the reference-signal generating unit 27 inputs, as the reference signal Vslop that is a comparison voltage to one input terminal RAMP of the voltage comparing unit 252, a stepwise or linear voltage waveform that is changed with time in a sawtooth shape (a ramp shape) as a whole with an initial voltage SLP_ini set as a start point. The voltage comparing unit 252 compares the reference signal Vslop and the pixel signal voltage Vx of the vertical signal line 19 supplied from the pixel array unit 10.

Simultaneously with the input of the reference signal Vslop to the input terminal RAMP of the voltage comparing unit 252, the counter unit 254 arranged for each of the rows measures comparison time in the voltage comparing unit 252 in synchronization with the reference signal Vslop generated from the reference-signal generating unit 27. Actually, the data storage control pulse HLDC is set to inactive L for generation of the reference signal Vslop. Therefore, the counter unit 254 starts down-count from an initial value "0" as a P-phase count operation. In other words, the counter unit 254 starts count processing in a negative direction.

The voltage comparing unit 252 compares the reference signal Vslop from the reference-signal generating unit 27 and the pixel signal voltage Vx inputted via the vertical signal line 19. When both the voltages are the same, the voltage comparing unit 252 inverts a comparate output from the H level to the L level. In other words, the voltage comparing unit 252 compares a voltage signal (the reset level Srst) corresponding to the reset level Vrst and the reference signal Vslop, generates a pulse signal of active low (L) having a magnitude in a time axis direction corresponding to a magnitude of the reset level Vrst, and supplies the pulse signal to the counter unit 254.

In response to a result of the comparison, the counter unit 254 stops the count operation substantially simultaneously with inversion of the comparate output and latches (stores) a count value (set as "−Drst" when a sign is taken into account) at that point as pixel data to complete AD conversion. In other words, the counter unit 254 counts, using the count clock CK0, the width of the pulse signal of active low (L) having a magnitude in the time axis direction obtained by the comparison processing in the voltage comparing unit 252 to obtain a count value indicating a digital value Drst (indicating −Drst when a sign is taken into account) corresponding to a magnitude of the reset level Vrst.

When a predetermined down-count period elapses, the communication and timing control unit 20 sets the data storage control pulse HLDC to active H (t14). Consequently, the reference-signal generating unit 27 stops the generation of the reference signal Vslop of a ramp shape (t14) and returns to the initial voltage SLP_ini.

During the P-phase processing, the reset level Vrst at the pixel signal voltage Vx is detected by the voltage comparing unit 252 and a count operation is performed by the counter unit 254. Therefore, the communication and timing control unit 20 reads out the reset level Vrst of the unit pixels 3 to carry out AD conversion of the reset level Vrst.

During the following second processing, i.e., a processing period of a data phase (which may be abbreviated as D phase) that is an AD conversion period for the signal level Ssig, in addition to the reset level Vrst, the communication and timing control unit 20 reads out the signal component Vsig corresponding to an amount of incident light in each of the unit pixels 3 and performs an operation same as P-phase readout. First, the communication and timing control unit 20 sets a count mode control signal UDC to a high level and sets the counter unit 254 in the up-count mode (t16).

In this case, in the unit pixels 3, the communication and timing control unit 20 sets a transfer signal φTRG to active H while keeping a vertical selection signal φVSEL of a readout object row Vn in active H and reads out the signal level Ssig to the vertical signal line 19 (t18 to t19). When the signal level Ssig on the vertical signal lines 19 (H1, H2, . . . ) converges and stabilizes, the communication and timing control unit 20 uses the data storage control pulse HLDC as the control data CN4 and sets the data storage control pulse HLDC to inactive L such that the reference signal Vslop starts to change simultaneously with the start of the count operation in the counter unit 254 (t20).

In response, the reference-signal generating unit 27 inputs, as the reference signal Vslop that is a comparison voltage to one input terminal RAMP of the voltage comparing unit 252, a stepwise or linear voltage waveform that is changed with time in a sawtooth shape (a RAMP shape) as a whole with the initial voltage SLP_ini set as a start point and having a tilt same as that in the P phase. The voltage comparing unit 252 compares the reference signal Vslop and the pixel signal voltage Vx of the vertical signal line 19 supplied from the pixel array unit 10.

Simultaneously with the input of the reference signal Vslop to the input terminal RAMP of the voltage comparing unit 252, the counter unit 254 arranged for each of the rows measures comparison time in the voltage comparing unit 252 in synchronization with the reference signal Vslop generated from the reference-signal generating unit 27. As described above, actually, the data storage control pulse HLDC is set to inactive L for generation of the reference signal Vslop. Therefore, the counter unit 254 starts, as a D-phase count operation, up-count, which is opposite to the down-count in the P phase, from the digital value Drst (here, a negative value) of the reset level Srst of the pixel signal voltage Vx acquired during P-phase readout and AD conversion. In other words, the counter unit 254 starts count processing in a positive direction.

The voltage comparing unit 252 compares the reference signal Vslop of a ramp shape from the reference-signal generating unit 27 and the pixel signal voltage Vx inputted via the vertical signal line 19. When both the voltages are the same, the voltage comparing unit 252 inverts a comparate output from the H level to the L level (t22). In other words, the voltage comparing unit 252 compares a voltage signal (the signal level Ssig of the pixel signal voltage Vx) corresponding to the signal component Vsig and the reference signal Vslop, generates a pulse signal of active low (L) having a magnitude in a time axis direction corresponding to a magnitude of the signal component Vsig, and supplies the pulse signal to the counter unit 254.

In response to a result of the comparison, the counter unit 254 stops the count operation substantially simultaneously with inversion of the comparate output and latches (stores) a count value at that point as pixel data to complete AD conversion (t22). In other words, the counter unit 254 counts, using the count clock CK0, the width of the pulse signal of active low (L) having a magnitude in the time axis direction obtained by the comparison processing in the voltage comparing unit 252 to obtain a count value corresponding to the signal level Ssig at the pixel signal voltage Vx.

When a predetermined up-count period elapses, in the unit pixels 3, the communication and timing control unit 20 sets the vertical selection signal φVSEL of the readout object row Vn to inactive L, prohibits output of the pixel signal So to the vertical signal line 19, and sets, for the next readout object row Vn+1, the vertical selection signal φVSEL to active H (t26). In this case, the communication and timing control unit 20 prepares for processing for the next readout object row Vn+1. For example, the communication and timing control unit 20 sets the count mode control signal UDC to a low level and sets the counter unit 254 in the down-count mode.

During the D-phase processing, the signal level Ssig at the pixel signal voltage Vx is detected by the voltage comparing unit 252 and a count operation is performed by the counter unit 254. Therefore, the communication and timing control unit 20 reads out the signal component Vsig of the unit pixels 3 to carry out AD conversion of the signal level Ssig.

The signal level Ssig is a level obtained by adding the signal component Vsig to the reset level Srst. Therefore, a count value as a result of AD conversion of the signal level Ssig is basically "Drst+Dsig". However, since a start point of up-count is "−Drst" as a result of AD conversion of the reset level Srst, a count value actually stored is "−Drst+(Dsig+Drst)=Dsig.

A count operation in the counter unit 254 is down-count during P-phase processing and is up-count during D-phase processing. Therefore, in the counter unit 254, difference processing (subtraction processing) is automatically performed between the count value "−Drst" as the result of AD conversion of the reset level Srst and the count value "Drst+Dsig" as the result of AD conversion of the signal level Ssig. The count value Dsig corresponding to a result of the difference processing is stored in the counter unit 254. The count value Dsig stored in the counter unit 254 corresponding to the result of the difference processing represents digital data corresponding to the signal component Vsig.

As described above, according to the difference processing in the counter unit 254 by the readout and the count processing performed twice, i.e., the down-count during the P-phase processing and up-count during the D-phase processing, it is possible to remove the reset level Vrst including variation for each of the unit pixels 3. It is possible to acquire, with the simple structure, an AD conversion result of only the signal component Vsig corresponding to an amount of incident light in each of the unit pixels 3. Therefore, the column AD circuit 250 operates not only as a digital conversion unit that converts an analog pixel signal into digital pixel data but also as a CDS (Correlated Double Sampling) processing function unit.

The column AD circuit 250 includes the data storing unit 256 at a post stage of the counter unit 254. The column AD circuit 250 can transfer, before an operation of the counter unit 254, a count result of the preceding row Hx−1 to the data storing unit 256 on the basis of the memory transfer instruction pulse CN8 from the communication and timing control unit 20. In other words, after an AD conversion period ends, the column AD circuit 250 saves data in the counter unit 254 in the data storing unit 256 and starts AD conversion for the next row Vx+1. The data in the data storing unit 256 is selected by the horizontal scanning unit 12 in order in the background of the AD conversion and can be read out using the output circuit 28.

Principle of the Column AD Conversion Processing According to this Embodiment

In the AD conversion according to the comparative example described above, the AD conversion and the CDS function for the signal component Vsig in the pixel signal voltage Vx are simultaneously realized by the difference processing in the counter unit 254 by the two time of readout and count processing, i.e., the down-count during the P-phase processing and the up-count during the D-phase processing. However, as it is evident from operations of the AD conversion processing, a count mode has to be switched in order to simultaneously realize the AD conversion and the CDS function. To cope with the switching of the count mode, it is necessary to adopt a mechanism of mode switching in the counter units 254 in all the columns. Therefore, there is inconvenience in that a size of the counter area increases.

In this embodiment, taking this problem into account, when AD conversion system referred to as a reference signal comparison type or the like is adopted, a mechanism that can perform a difference processing function simultaneously with AD conversion while controlling an increase in an area of the counter units 254 is realized. This mechanism is specifically explained below.

In terms of a circuit configuration, as shown in FIG. 1A, rather than adopting a mechanism for switching a count mode, a mechanism for performing counting in an identical count mode during first AD conversion processing and second AD conversion processing and setting count phases in the two times of AD conversion processing different is adopted. During the second count processing, the count processing is started according to a result of the first count processing. This embodiment is the same as the comparative example in this point.

"Setting count phases different" means that count processing periods are set different during the first AD conversion processing (e.g., P-phase processing) and the second AD conversion processing (e.g., D-phase processing). More specifically, the difference between the count phases is equivalent to a difference between periods of count processing, i.e., whether the count processing is performed in a period from a point when a change in the reference signal Vslop is started until a point when the reference signal Vslop and the pixel signal voltage Vx coincide with each other or performed in a period from a point when the reference signal Vslop and the pixel signal voltage Vx coincide with each other until a point when time reaches a maximum AD conversion period in the AD conversion (usually, a point when the change in the reference signal Vslop is stopped).

In this specification, the count processing performed in the period from a point when a change in the reference signal Vslop is started until a point when the reference signal Vslop and the pixel signal voltage Vx coincide with each other is also referred to as real number count processing. On the other hand, the count processing performed in the period from a point when the reference signal Vslop and the pixel signal voltage Vx coincide with each other until a point when time reaches a maximum AD conversion period in the AD conversion is also referred to as complement count processing.

In general, the period from a point when a change in the reference signal Vslop is started until a point when the reference signal Vslop and the pixel signal voltage Vx coincide with each other and the period from a point when the reference signal Vslop and the pixel signal voltage Vx coincide with each other until a point when time reaches a maximum AD conversion period in the AD conversion are associated with output levels of the comparison pulse COMP outputted from the voltage comparing unit 252. Therefore, the start of the count processing only has to be switched between a period in which the comparison pulse COMP is at the L level and a period in which the comparison pulse COMP is at the H level.

In addition, in this embodiment, to make it possible to acquire a difference processing result as a result of the two times of count processing, as a first method, in starting the count processing in the first time, a count value equivalent to a maximum AD conversion period in the AD conversion in which the count processing is performed after a point when the reference signal Vslop and the pixel signal voltage Vx coincide with each other is initially set as an initial value Dini with a sign (plus or minus) corresponding to a count mode attached and the count processing is started from the initial value Dini. Alternatively, as a second method, while the count processing is started from "0" as in the comparative example, a count is corrected by initial value Dini at a post stage of the counter unit 254 after the count processing in the second time is completed. Since it is unnecessary to correct a count by the initial value Dini at the post stage of the counter unit 254 in the first method, the first method is a method suitable when an AD conversion processing result for one pixel only has to be obtained. On the other hand, the second method is a method suitable when an AD conversion processing result of multiply-accumulate for signal components Vsig of plural pixels is obtained.

In the example explained above, concerning the pixel signal voltage Vx for one pixel, the digital data Dsig of the signal component Vsig indicated by a difference result between the reset level Srst and the signal level Ssig is acquired. However, by using this mechanism, it is also possible to acquire digital data of a subtraction processing result of arbitrary two kinds of processing object signals. In this case, complement count processing is applied to the subtrahend processing object signal and real number count processing is applied to the minuend processing object signal.

Principle: First Example

Figure 3:
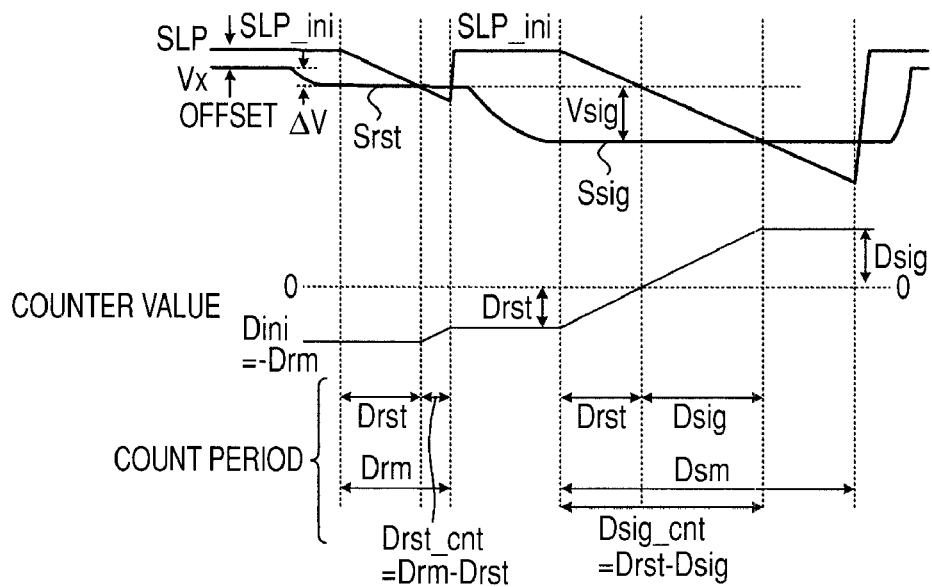
FIG. 3 is a diagram for explaining a first example of an operation principle of column AD conversion processing according to the embodiment.

FIG. 3 is a diagram for explaining a first example of an operation principle of the column AD conversion processing according to this embodiment. The first example shown in FIG. 3 is an example in which an up-counter is used as the counter unit 254. In this example, during AD conversion processing for a reset level Srst in the first time, which is an example of a processing object signal of a subtraction element, count processing is performed in the up-count mode in a period from a point when the reference signal Vslop and the pixel signal voltage Vx (the reset level Srst) coincide with each other until a point when the reference signal Vslop reaches a predetermined end value, specifically, in a period until a point when time reaches a maximum AD conversion period in the AD conversion. During AD conversion processing for a signal level Ssig in the second time, which is an example of an addition element, count processing is performed in the up-count mode in a period from a point when the reference signal Vslop starts a change from the initial value SLP_ini until a point when the reference signal Vslop and the pixel signal voltage Vx (the signal level Ssig) coincide with each other.

In this case, as it is evident from the figure, a count number (Drst_cnt) in the AD conversion processing for the reset level Srst in the first time is a value obtained by subtracting, from a maximum count number Drm corresponding to the maximum AD conversion period for the reset level Srst, a count number Drst corresponding to the period from a point when a change in the reference signal Vslop is started until a point when the reference signal Vslop and the pixel signal voltage Vx (the reset level Srst) coincide with each other (=Drm−Drst). Therefore, a count value D1 stored in the counter unit 254 after the AD conversion processing in the first time is as indicated by Equation (1-1) below.

If the initial value Dini of the count processing in the first time is set to a negative number of the maximum count number Drm corresponding to the maximum AD conversion period for the reset level Srst, a count value D1 stored in the counter unit 254 after the AD conversion processing for the reset level Srst in the first time is indicated by Equation (1-2).

$$D1=Dini+(Drm-Drst) \quad (1\text{-}1)$$

$$D1=Dini+(Drm-Drst)=-Drst \quad (1\text{-}2)$$

It is seen that, during P-phase processing in the first time, when the voltage comparing unit 252 detects the reset level Vrst at the pixel signal voltage Vx and the counter unit 254 performs a count operation, it is possible to read out the reset level Vrst of the unit pixels 3, carry out AD conversion for the reset level Vrst, and store digital data of the reset level Vrst as a negative number by setting the initial value Dini to a negative number of the maximum count number Drm.

In the comparative example, in order to readout the reset level Vrst of the unit pixels 3, carry out AD conversion for the reset level Vrst, and store digital data of the result level Vrst as a negative number, during count processing in the first time, a count mode has to be different from a count mode during count processing in the second time. However, when the mechanism of the operation principle of the first example is adopted, such switching of the count mode is unnecessary.

During AD conversion processing for a signal level Ssig in the second time after this, count processing is started from the count value D1 (=Dini+(Drm−Drst)=−Drst), which is stored in the counter unit 254 after the AD conversion processing in the first time, in the up-count mode same as that in the first time. A count value at a point when the reference signal Vslop and the pixel signal voltage Vx (the signal level Ssig) coincide with each other is stored. As it is evident from the figure, a count number (Dsig_cnt) in the AD conversion processing for the signal level Ssig in the second time corresponds to a value obtained by combining the reset level Srst and the signal component Vsig. Therefore, the count number is "Drst+Dsig". Therefore, a count value D2 stored in the counter unit 254 after the AD conversion processing in the second time is as indicated by Equation (2) below.

$$\begin{aligned} D2 &= Dini + (Drm - Drst) + (Drst + Dsig) \\ &= -Drst + (Drst + Dsig) \\ &= Dsig \end{aligned} \quad (2)$$

As it is evident from Equation (2), in a subtraction expression on a second row, subtraction processing is performed between the reset level Srst and the signal level Ssig. As it is seen from the subtraction expression, the signal level Ssig is a level obtained by adding the signal component Vsig to the reset level Srst. Therefore, although a count number of an AD conversion result of the signal level Ssig is basically "Drst+ Dsig", a count value actually stored can be "−Drst+(Dsig+ Drst)=Dsig" as in the comparative example by setting a start point of the count processing in the second time to "−Drst", which is an AD conversion result of the reset level Srst.

As indicated by the operation principle of the first example, even if a count mode of the count processing in the second time is identical with that of the count processing in the first time (in this example, the up-count mode), count phases in the first time and the second time are set different and the initial value Dini of the count processing in the first time is set to a negative number of the maximum count number Drm of the count processing in the first time. Then, difference processing (subtraction processing) between the count number "−Drst" as the AD conversion result of the reset level Srst and the count number "Drst+Dsig" as the AD conversion result of the signal level Ssig is automatically performed in the counter unit 254. The counter unit 254 can store a count number Dsig corresponding to a result of the difference processing. Therefore, it is possible to simultaneously realize the CDS function and the AD conversion for the signal component Vsig as in the comparative example.

In the example described above, the initial value Dini is a negative number of the maximum count number Drm. However, the initial value Dini may be "0" as in the comparative example. In this case, the count value D2 stored in the counter unit 254 after the count processing in the second time is as indicated by Equation (3) and is obtained by adding the maximum count number Drm to the digital value Dsig of the signal component Vsig.

$$D2=Dini+(Drm-Drst)+(Drst+Dsig)=Drm+Dsig \quad (3)$$

The maximum count number Drm is a constant and can be adjusted from the outside by the communication and timing control unit 20. A value of the maximum count number Drm can be arbitrarily determined according to the maximum AD conversion period for the reset level Srst. As it is seen from this, the communication and timing control unit 20 has a function of a correcting unit that acquires, in acquiring digital data of a multiply-accumulate result of plural processing object signals, the digital data of the multiply-accumulate result by correcting a count value (in this example, Drm) corresponding to a period in which the reference signal Vslop in the count processing for the processing object signal of the subtraction element reaches an end value from the initial value Dini.

The correction can be performed by providing the digital arithmetic unit 29 at the post stage of the counter unit 254 and performing a correction operation. It is possible to easily acquire the digital value Dsig of the signal component Vsig. In this case, the digital arithmetic unit 29 has the function of the correcting unit. However, by setting the initial value Dini to a negative number of the maximum count number Drm, a value finally obtained in the two times of count processing indicates a positive signal component Vsig. Therefore, if the digital data Dsig of the signal component Vsig of one pixel only has to be acquired, affinity with an existing system is high.

Specific Processing: First Example

Figure 4:
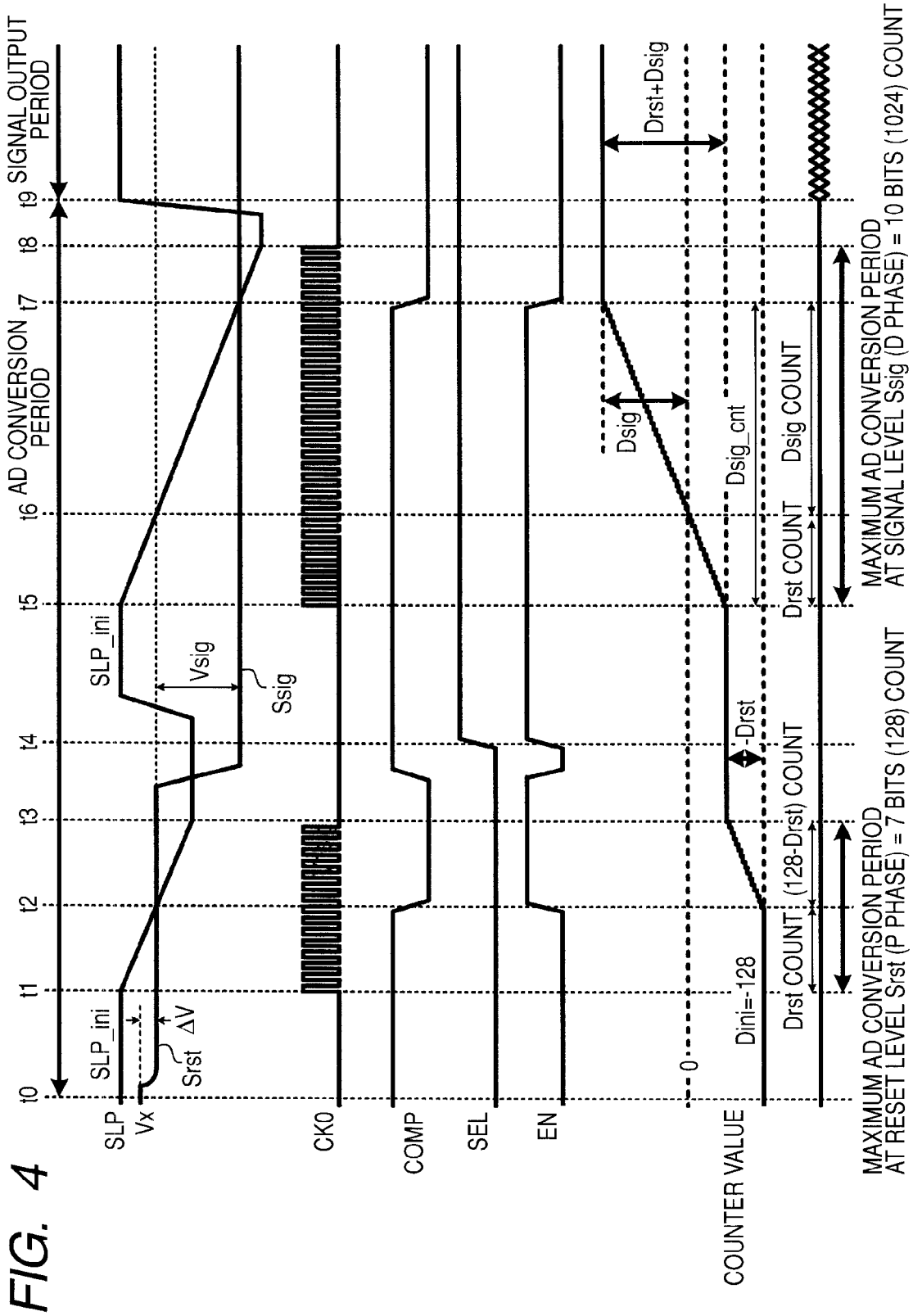
FIG. 4 is a timing chart for explaining an operation of a specific example (specific processing of a first example) in which the first example of the operation principle is applied to the solid-state imaging apparatus according to the first embodiment shown in FIG. 1A.

FIG. 4 is a timing chart for explaining an operation of a specific example (specific processing of the first example) in which the first example of the operation principle is applied to the solid-state imaging device 1 according to the first embodiment shown in FIG. 1A.

In the specific processing of the first example, as a mechanism for subjecting an analog pixel signal voltage Vx obtained from the unit pixel 3 to digital conversion, a method of obtaining a count value including information on the reset level Srst and the signal level Ssig is adopted. The count value is obtained by finding a point where the reference signal Vslop and respective voltages of the reset level Srst or the signal level Ssig obtained from the unit pixels 3 coincide with each other, counting, for the reset level Srst, desired count time from a point when the reference signal Vslop and the reset level Srst of the pixel signal voltage Vx coincide with each other (in this example, until time reaches the maximum AD conversion period for the reset level Srst) and counting, for the signal level Ssig, time from a generation point of the reference signal Vslop until the signal level Ssig and the reference signal Vslop coincide with each other using the count clock CK0.

The communication and timing control unit 20 supplies the count clock CKdac to the reference-signal generating unit 27 to supply the count clock CK0 to the counter unit 254 in synchronization with generation of the reference signal Vslop by the reference-signal generating unit 27. When time reaches the maximum AD conversion period in the respective times, the communication and timing control unit 20 stops the supply of the count clock CK0. At the same time, the reference-signal generating unit 27 stops the change in the reference signal Vslop.

In the pixel signal voltage Vx outputted from the vertical signal line 19, in time series, the signal level Ssig appears after the reset level Srst indicating a reset component ΔV including noise of a pixel signal as a reference component. When processing in the first time is applied to the reset level Srst (the reset component ΔV), processing in the second time is processing for the signal level Ssig obtained by adding the signal component Vsig to the reset level Srst.

For read out in the first time, the communication and timing control unit 20 resets a count value of the counter unit 254 to a desired initial value Dini (here, a negative number of the maximum count number Drm corresponding to the maximum AD conversion period for the reset level Srst=−128) (within t0 to t1). In other words, an initial value Dini of a count operation in the first time is "−128" obtained by subtracting "−128" for a 7-bit count from the count value. When the count-phase switching unit 253 is controlled by the count period control signal SEL, the count-phase switching unit 253 sets a mode to output a signal in an anti-phase of the voltage comparing unit 252 as the count enable signal EN. After readout in the first time from the unit pixels 3 in an arbitrary row Hx to the vertical signal line 19 is stabilized, the communication and timing control unit 20 supplies control data for generating the reference signal Vslop to the reference-signal generating unit 27.

In response, the reference-signal generating unit 27 inputs the reference signal Vslop changed in a ramp shape as a whole to one input terminal of the voltage comparing unit 252 as a comparison voltage. The voltage comparing unit 252 compares the reference signal Vslop and the pixel signal voltage Vx of an arbitrary vertical signal line 19 supplied from the pixel array unit 10. Simultaneously with the input of the reference signal Vslop to the voltage comparing unit 252, in order to measure a comparison time in the voltage comparing unit 252 using the counter unit 254 arranged in each of the rows, the communication and timing control unit 20 inputs the count clock CK0 to the clock terminal CK of the counter unit 254 in synchronization with a change in the reference signal Vslop generated from the reference-signal generating unit 27.

The voltage comparing unit 252 compares the reference signal Vslop and the pixel signal voltage Vx (=reset level Srst). At a point when the reference signal Vslop and the reset level Srst coincide with each other, the voltage comparing unit 252 inverts the comparison pulse COMP from the H level to the L level (t2). The voltage comparing unit 252 inputs the comparison pulse COMP to the count-phase switching unit 253. An inverting operation is performed according to the control by the count period control signal SEL. The count enable signal EN as an output of the count-phase switching unit 253 is inverted from the L level to the H level at the point when the reference signal Vslop and the reset level Srst coincide with each other in the voltage comparing unit 252. In response to a result of this inversion, the counter unit 254 counts, in the up-count mode, time from a point when the comparison pulse COMP of the voltage comparing unit 252 is inverted until a point when the count clock CK0 is stopped. The counter unit 254 stores a count value at a point when the count processing in the first time is stopped and finishes the AD conversion. At this point, the count value stored in the counter unit 254 is "Dini+(Drm−Drst)=−Drst" as it is understood from the explanation of the operation principle of the first example described above.

A period in which the count clock CK0 is stopped can be controlled by the communication and timing control unit 20. Here, the communication and timing control unit 20 stops the count clock CK0 by supplying a count clock of 128 counts (7-bit count) from the start of a temporal change in the reference signal Vslop (the start of count time) to the count clock CK. Simultaneously with this, the reference-signal generating unit 27 stops the generation of the reference signal Vslop. Consequently, the temporal change in the reference signal Vslop is also stopped (t3).

Subsequently, during readout in the second time, the communication and timing control unit 20 reads out the signal component Vsig corresponding to an amount of incident light in each of the unit pixels 3 in addition to the reset level Srst and performs an operation same as that in the readout in the first time. First, the communication and timing control unit 20 controls the count-phase switching unit 253 using the count period control signal SEL. Then, the count-phase switching unit 253 sets a mode to output a signal in-phase with the comparison pulse COMP as the count enable signal EN (t4). After the readout in the second time from the unit pixels 3 in the arbitrary row Hx to the vertical signal line 19 is stabilized, the communication and timing control unit 20 supplies control data for generating the reference signal Vslop to the reference-signal generating unit 27.

In response to the supply of the control data, the reference-signal generating unit 27 inputs the reference signal Vslop changed with time in a ramp wave shape as a whole to the voltage comparing unit 252 (t5). The voltage comparing unit 252 compares the reference signal Vslop and the signal level Ssig. Simultaneously with the input of the reference signal Vslop to the voltage comparing unit 252, in order to measure comparison time in the voltage comparing unit 252 using the counter unit 254 arranged in each of the rows, the communication and timing control unit 20 inputs the count clock CK0 to the clock terminal of the counter unit 254 in synchronization with a change in the reference signal Vslop generated from the reference-signal generating unit 27. An initial value of a count operation in the second time is set to "−Drst", which is digital data of the reset level Srst of the unit pixels 3 acquired in the processing in the first time. In other words, count processing in the second time is continued from the count value obtained in the AD conversion processing in the first time in the up-count mode as in the count processing in the first time.

The voltage comparing unit 252 compares the reference signal Vslop and the signal level Ssig. The voltage comparing unit 252 inverts the comparison pulse COMP from the H level to the L level at a point when the reference signal Vslop and the signal level Ssig coincide with each other (t7). The voltage comparing unit 252 inputs the comparison pulse COMP to the count-phase switching unit 253. An output of the count-phase switching unit 253 is inverted from the H level to the L level according to the control by the count period control signal SEL at the point when the reference signal Vslop and the signal level Ssig coincide with each other. In response to a result of the inversion, the counter unit 254 counts, in the up-count mode same as that in as the first time, time from a point when the reference signal Vslop is started to be generated until a point when the comparison pulse COMP is inverted (i.e., a count number until Vslop becomes equal to ΔV+Vsig), stores a count value at a point when the count processing is stopped, and finishes the AD conversion.

A period in which the count clock CK0 in the second time is stopped can also be controlled by the communication and timing control unit 20. Here, the count clock CK0 is stopped by supplying a count clock of 1024 counts (10-bit count) from the start of a temporal change in the reference signal Vslop (the start of count time) to the count clock CK0. Simultaneously with this, the reference-signal generating unit 27 stops the generation of the reference signal Vslop. Consequently, the temporal change in the reference signal Vslop is also stopped (t8). At timing t9 and subsequent timing after this, the pixel signal data Dsig is outputted to the outside. As a whole, timing t0 to t8 corresponds to an AD conversion period and timing t9 and subsequent timing correspond to a signal output period.

In this example, the counter unit 254 performs the count by inverting the comparison pulse COMP during the readout in the first time and using the comparison pulse COMP as the count enable signal EN in-phase during the readout in the second time to thereby automatically perform subtraction (in a third row) indicated by Equation (4) in the counter unit 254. A count value corresponding to a result of the subtraction is stored in the counter unit 254.

$$\begin{aligned} D2 &= \text{initial value } Dini + (\text{count number in the first time}) + \\ &\quad (\text{count number in the second time}) \\ &= -128 + (128 - Drst) + (Drst + Dsig) \\ &= -Drst + (Drst + Dsig) \\ &= Dsig \end{aligned} \quad (4)$$

As it is evident from Equation (4), a subtraction expression in the third row is identical with the subtraction expression in the second row of Equation (2). Subtraction processing is performed between the reset level Srst and the signal level Ssig. According to the two times of count processing in the up-count mode for the reset level Srst and the signal level Ssig, a count value stored in the counter unit 254 is set to Dsig corresponding to the signal component Vsig.

As described above, according to the count processing in the up-count mode during the readout for the reset component ΔV in the first time and the count processing in the up-count mode during the readout for the signal component Vsig in the second time, subtraction processing for respective digital data of the signal level Ssig and the reset level Srst is performed in the counter unit 254. It is possible to remove the reset component ΔV including variation in each of the unit pixels 3 and an offset component in each of the column AD circuits 250. It is also possible to extract, with simple structure, only the digital data Dsig of the signal component Vsig corresponding to an amount of incident light in each of the unit pixels 3. In this case, there is an advantage that reset noise can also be removed.

Therefore, the column processing unit 26 (specifically, the column AD circuit 250 in each of the columns) according to this embodiment operates not only as a digital converter that converts an analog pixel signal into pixel digital data but also as a CDS (Correlated Double Sampling) processing function unit.

As described above, the two times of AD conversion processing is performed by giving only a single count mode to the counter of the column AD unit in which the AD conversion units are arranged in column parallel and changing a driving system to one different from that in the comparative example. Therefore, a CDS processing function can be realized in the column processing unit 26 (specifically, the column AD circuit 250) and only the digital data Dsig of the signal component Vsig from the unit pixels 3 can be acquired. Consequently, since a component for each of bits for switching the count mode is unnecessary, it is possible to solve the problems of a circuit size and a circuit area of the counter units 254 that occupy a large area of the column AD circuits 250.

For example, in realizing the processing timing according to the comparative example, it is necessary to arrange up-down counters column parallel and use the functions of the up-count mode and the down-count mode to perform CDS according to subtraction of two signals. On the other hand, in this system, counters arranged column parallel only have to have the function of the up-count mode. Therefore, it is possible to eliminate a selector and the like used when the up-down counters are used, use a simple up-counter, and reduce a counter area.

In particular, in order to realize high resolution, components (e.g., a selector) for count mode switching increase according to an increase in the number of bits. However, since only one count-phase switching unit 253 used in the mechanism according to this embodiment has to be provided in the counter units arranged in column parallel, it can be said that an effect of a reduction in an area is large. For example, in the case of 12-bit accuracy, only twelve counter components (flip-flops) and one count-phase switching unit 253 (e.g., an EX-OR gate) have to be provided.

Specific Processing: Second Example

Figure 5:
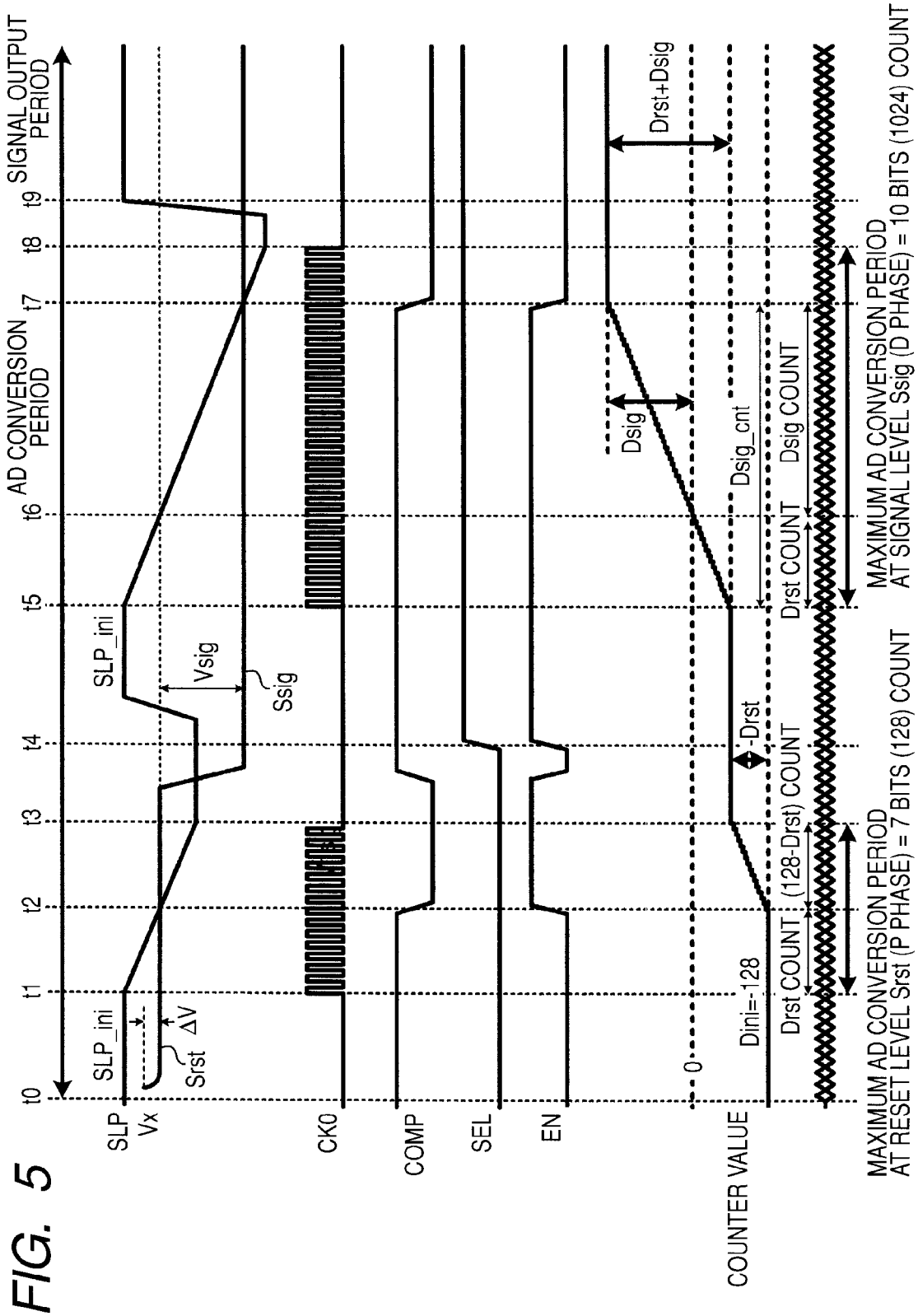
FIG. 5 is a timing chart for explaining an operation of a specific example (specific processing of a second example) in which the first example of the operation principle is applied to the solid-state imaging device according to the second embodiment shown in FIG. 1B.

FIG. 5 is a timing chart for explaining an operation of a specific example (specific processing of a second example) in which the first example of the operation principle is applied to the solid-state imaging device 1 according to the second embodiment shown in FIG. 1B. AD conversion processing in the column AD circuit 250 is the same as that in the first example of the specific processing. Therefore, detailed explanation of the AD conversion processing is omitted.

In the case of the specific processing of the second example, since the first example of the operation principle is applied to the solid-state imaging device 1 shown in FIG. 1B, the data storing unit 256 is added to the solid-state imaging device 1 according to the first embodiment. Basic operations such as the AD conversion processing are the same as those in the first example of the specific processing. However, before the operation of the counter unit 254, a count result of a preceding row Hx−1 is transferred to the data storing unit 256 on the basis of the memory transfer instruction pulse CN8 from the communication and timing control unit 20. The operations as a whole correspond to an AD conversion period and a signal output period.

In the specific processing of the first example, since pixel data can be outputted to the outside of the column processing unit 26 only after the readout processing in the second time, i.e., the AD conversion processing is completed, there is a limit in readout processing. On the other hand, in the specific processing of the second example, since a subtraction processing result of the last time can be transferred to the data storing unit 256 prior to the readout processing (AD conversion processing) in the first time, there is no limit in readout processing. Consequently, it is possible to perform, in parallel, an operation for outputting a signal to the outside from the data storing unit 256 through the horizontal signal line 18 and the output circuit 28 and a readout operation and a count operation of the counter unit 254 for the current row Hx. This makes it possible to perform more efficient signal output.

Principle: Second Example

Figure 6:
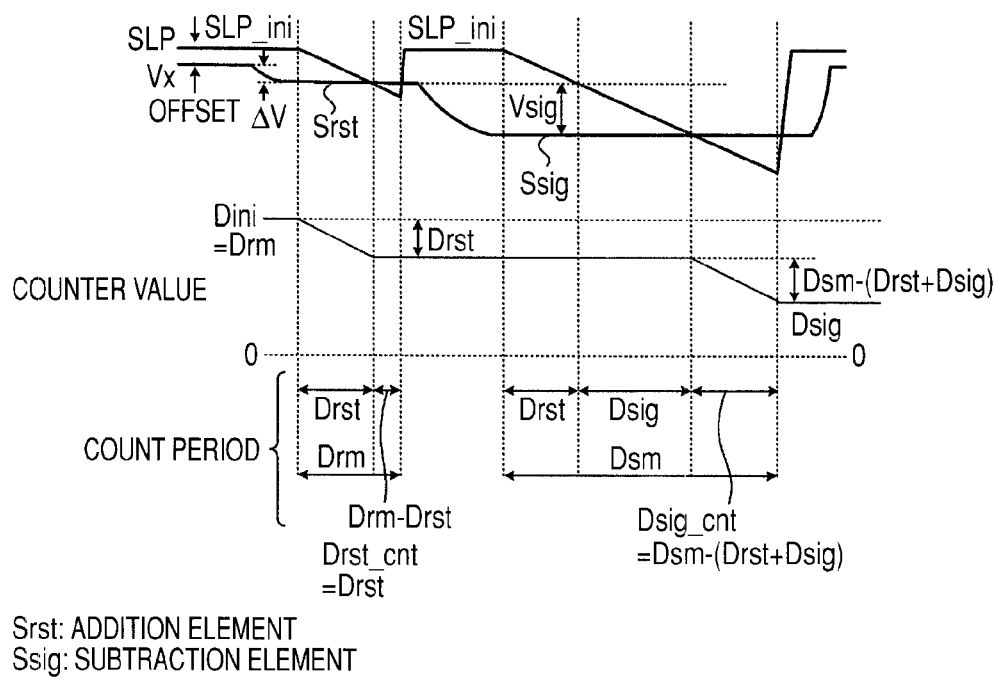
FIG. 6 is a diagram for explaining a second example of the operation principle of the column AD conversion processing according to the embodiment.

FIG. 6 is a diagram for explaining a second example of the operation principle of the column AD conversion processing according to this embodiment. The second example shown in FIG. 6 is an example in which a down-counter is used as the counter unit 254. During AD conversion processing for the reset level Srst in the first time, which is an example of an addition element, count processing is performed in the down-count mode in a period from a point when the reference signal Vslop starts a change from the initial value SLP_ini until a point when the reference signal Vslop and the pixel signal voltage Vx (the reset level Srst) coincide with each other. During AD conversion processing for the signal level Ssig in the second time, which is an example of a subtraction element, count processing is performed in the down-count mode in a period from a point from the reference signal Vslop and the pixel signal voltage Vx (the signal level Ssig) coincide with each other until a point when the reference signal Vslop reaches a predetermined end value, specifically, a period until time reaches a maximum AD conversion period in the AD conversion.

In this case, a count number Drst_cnt in the AD conversion processing for the reset level Srst in the first time is the digital value Drst of the reset level Srst. Therefore, taking into account the fact that a count mode is the down-count mode, the count value D1 stored in the counter unit 254 after the AD conversion processing in the first time is as indicated by Equation (5) below.

In the case of this example, the reset level Srst in the first time is an example of the addition element. However, since subtraction processing is substantially performed according to a combination with the down-count mode for performing counting in a negative direction, as indicated by a first row of Equation (6-1), in practice, the addition element can be converted into a subtraction element after AD conversion.

$$D1 = Dini - Drst \quad (5)$$

During AD conversion processing for the signal level Ssig in the second time after this, count processing is started, in the down-count mode same as that in the first time, from a count number "Dini−Drst" stored in the counter unit 254 after the AD conversion processing in the first time at a point when the reference signal Vslop and the pixel signal voltage Vx (the signal level Ssig) coincide with each other. When time reaches a maximum AD conversion period in the AD conversion, the count processing is stopped and a count value at that point is stored in the counter unit 254.

As it is seen from the figure, a count number Dsig_cnt in the AD conversion processing for the signal level Ssig in the second time is a value (=Dsm−(Drst+Dsig)) obtained by subtracting a count number "Drst+Dsig" corresponding to a period from a point when a change in the reference signal Vslop is started until a point when the reference signal Vslop and the pixel signal voltage Vx (the signal level Ssig) coincide with each other from a maximum count number Dsm corresponding to a maximum AD conversion period for the signal level Ssig. Therefore, taking into account the fact that a count mode is the down-count mode, a count value D2 stored in the counter unit 254 after the AD conversion processing in the second time is as indicated by Equation (6-1).

In the case of this example, the signal level Ssig in the second time is an example of a subtraction element. However, since subtraction processing is substantially performed according to a combination with the down-count mode for performing counting in a negative direction, as indicated by the first row of Equation (6-1), in practice, the subtraction element can be converted into an addition element after AD conversion by combining the subtraction element with the subtraction processing.

As it is evident from Equation (6-1), a subtraction expression in a second row include a component identical with that in the subtraction expressions in the second row of Equation (2) and the third row of Equation (4). Therefore, subtraction processing is performed between the reset level Srst and the signal level Ssig. As a difference between Equations (2) and (4), there is a component of "Dini−Dsm". However, Dsig corresponding to the signal component Vsig can be acquired by the two times of count processing in the up-count mode for the reset level Srst and the signal level Ssig.

If the initial value Dini of the count processing in the first time is set to the maximum count number Dsm corresponding to the maximum AD conversion period for the signal level Ssig, the count value D2 stored in the counter unit 254 after the AD conversion processing for the signal level Ssig in the second time is indicated by Equation (6-2). As in the operation principles of the comparative example and the first example, a count value to be actually stored can be set to "Dsig".

$$D2 = Dini - Drst - (Dsm - (Drst + Dsig)) \quad (6\text{-}1)$$
$$= (Dini - Dsm) - Drst + (Drst + Dsig)$$
$$= Dini - Dsm + Dsig$$

$$D2 = Dini - Dsm + Dsig = Dsig \quad (6\text{-}2)$$

In other words, even if the two times of count processing are set in an identical mode (in this example, the down-count mode) as in the operation principle of the second example, count phases in the first time and the second time are set different and the initial value Dini of the count processing in the first time is set to a positive number of the maximum count number Dsm of the count processing in the second time. Then, difference processing (subtraction processing) between the count number "−Drst" as the AD conversion result of the reset level Srst and the count number "Drst+Dsig" as the AD conversion result of the signal level Ssig is automatically performed in the counter unit 254. The counter unit 254 can store a count number Dsig corresponding to a result of the difference processing. Therefore, it is possible to simultaneously realize the CDS function and the AD conversion for the signal component Vsig as operation principles in the comparative example and the first example. When the mechanism of the operation principle of the second example is adopted, as in the first example, switching of a count mode in the comparative example is unnecessary.

In the operation principle of the first example, complement count processing is performed for the reset level Srst side in the up-count mode and real number count processing is performed for the signal level Ssig side in the up-count mode to set a negative number of the maximum count number Drm in performing the complement count processing as the initial value Dini. Consequently, a count value to be actually stored is set to "Dsig". On the other hand, in the operation principle of the second example, real number count processing is performed for the reset level Srst side in the down-count mode and complement count processing is performed for the signal level Ssig side in the down-count mode to set a positive number of the maximum count number Dsm in performing the complement count processing as the initial value Dini. Consequently, a count value to be actually stored is set to "Dsig".

In the first example and the second example, the up-count mode or the down-count mode is set according to whether the complement count processing is performed once or twice. A positive number or a negative number is set as the initial value Dini according to a count mode while the initial value Dini is set to a value corresponding to the maximum count number Dsm in performing the complement count processing. Therefore, there is no large difference in basic mechanisms of the first example and the second example.

A count value stored in the counter unit 254 after the count processing in the second time is "Dini+(Drm−Drst)+(Drst+Dsig)=Dini+Drm+Dsig" in the operation principle of the first example. The count value is "Dini−Dsm+Dsig" in the operation principle of the second example. In both the operation principles of the first and second examples, the count values are obtained by adding adjustments between the initial value Dini and the maximum count numbers Drm and Dsm ("Dini+Drm" in the first example and "Dini−Dsm" in the second example) to the digital value Dsig of the signal component Vsig.

Although the initial value Dini is set to the maximum count number Dsm in the example described above, the initial number Dini may be "0" as in the comparative example. In this case, a count value stored in the counter unit 254 after the count processing in the second time is "Dini−Dsm+Dsig=−Dsm+Dsig", which is obtained by subtracting the maximum count number Dsm from the digital value Dsig of the signal component Vsig. The maximum count number Dsm is a constant and can be adjusted from the outside by the communication and timing control unit 20. A value of the maximum count number Dsm can be arbitrarily determined according to the maximum AD conversion period for the signal level Ssig. Therefore, the counting processing can be performed by providing the digital arithmetic unit 29 at the post stage of the counter unit 254 and performing a correction operation (in this example, addition). It is possible to easily acquire the digital value Dsig of the signal component Vsig. In this case, the digital arithmetic unit 29 has the function of the correcting unit. However, by giving the function of the correcting unit to the communication and timing control unit 20 and setting the initial Dini to the maximum count number Dsm, a value finally obtained in the two times of count processing indicates a positive signal component Vsig. Therefore, if the digital data Dsig of the signal component Vsig of one pixel only has to be acquired, affinity with an existing system is high.

Specific Processing: Third Example

Figure 7:
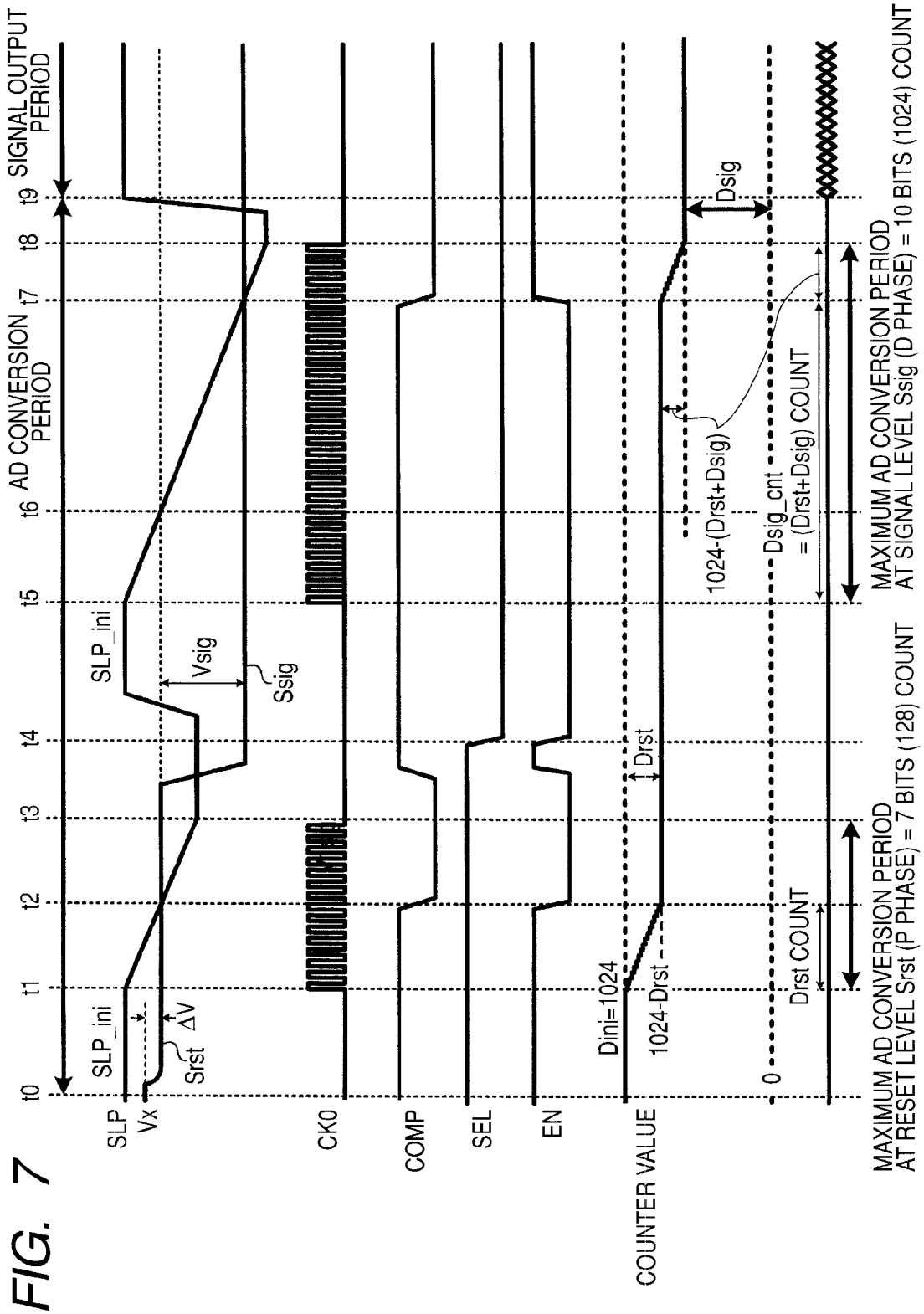
FIG. 7 is a timing chart for explaining an operation of a specific example (specific processing of a third example) in which a third example of the operation principle is applied to the solid-state imaging device according to the first embodiment shown in FIG. 1A.

FIG. 7 is a timing chart for explaining an operation of a specific example (specific processing of a third example) in which a third example of the operation principle is applied to the solid-state imaging device 1 according to the first embodiment shown in FIG. 1A.

In the specific processing of the third example, as a mechanism for subjecting an analog pixel signal voltage Vx obtained from the unit pixel 3 to digital conversion, a method of obtaining a count value including information on the reset level Srst and the signal level Ssig is adopted. The count value is obtained by finding a point where the reference signal Vslop and respective voltages of the reset level Srst or the signal level Ssig obtained from the unit pixels 3 coincide with each other, counting, for the reset level Srst, time from a point when the reference signal Vslop is generated until a point when the reset level Srst and the reference signal Vslop coincide with each other using the count clock CK0 and counting, for the signal level Ssig, desired count time from a point when the reference signal Vslop and the pixel signal voltage Vx coincide with each other (in this example, time reaches the maximum AD conversion period for the signal level Ssig) using the count clock CK0.

The communication and timing control unit 20 supplies the count clock CKdac to the reference-signal generating unit 27 to supply the count clock CK0 to the counter unit 254 in synchronization with generation of the reference signal Vslop by the reference-signal generating unit 27. When time reaches the maximum AD conversion period in the respective times, the communication and timing control unit 20 stops the supply of the count clock CK0. At the same time, the reference-signal generating unit 27 stops the change in the reference signal Vslop.

When processing in the first time is applied to the reset level Srst (the reset component ΔV), processing in the second time is processing for the signal level Ssig obtained by adding the signal component Vsig to there set level Srst. The specific processing of the third example is the same as the specific processing of the first example in this point.

For readout in the first time, the communication and timing control unit 20 resets a count value of the counter unit 254 to a desired initial value Dini (here, a positive number of the maximum count number Dsm corresponding to the maximum AD conversion period for the signal level Ssig=1024) (within t0 to t1). In other words, an initial value Dini of a count operation in the first time is an offset of "1024" for 10-bit count. When the count-phase switching unit 253 is controlled by the count period control signal SEL, the count-phase switching unit 253 sets a mode to output a signal in-phase with the voltage comparing unit 252 as the count enable signal EN. After readout in the first time from the unit pixels 3 in an arbitrary row Hx to the vertical signal line 19 is stabilized, the communication and timing control unit 20 supplies control data for generating the reference signal Vslop to the reference-signal generating unit 27.

In response, the reference-signal generating unit 27 inputs the reference signal Vslop changed in a ramp shape as a whole to one input terminal of the voltage comparing unit 252 as a comparison voltage. The voltage comparing unit 252 compares the reference signal Vslop and the pixel signal voltage Vx of an arbitrary vertical signal line 19 supplied from the pixel array unit 10. Simultaneously with the input of the reference signal Vslop to the voltage comparing unit 252, in order to measure a comparison time in the voltage comparing unit 252 using the counter unit 254 arranged in each of the rows, the reference-signal generating unit 27 inputs the count clock CK0 to the clock terminal CK of the counter unit 254 in synchronization with a change in the reference signal Vslop generated from the reference-signal generating unit 27.

The voltage comparing unit 252 compares the reference signal Vslop and the pixel signal voltage Vx (=reset level Srst). At a point when the reference signal Vslop and the reset level Srst coincide with each other, the voltage comparing unit 252 inverts the comparison pulse COMP from the H level to the L level (t2). The voltage comparing unit 252 inputs the comparison pulse COMP to the count-phase switching unit 253. According to the control by the count period control signal SEL, an output of the count-phase switching unit 253 is inverted from the H level to the L level at a point when the reference signal Vslop and the reset level Srst coincide with each other.

In response to a result of this inversion, the counter unit 254 counts, in the down-count mode, time from a point when the generation of the reference signal Vslop is started until a point when the comparison pulse COMP is inverted (i.e., by the count number until Vslop, ΔV, and the reset level Srst become equal to one another). The counter unit 254 stores a count value at a point when the count processing in the first time is stopped and finishes the AD conversion (t2). At this point, the count value stored in the counter unit 254 is "Dini−Drst=1024−Drst" as it is understood from the explanation of the operation principle of the second example described above.

A period in which the count clock CK0 is stopped can be controlled by the communication and timing control unit 20. Here, the communication and timing control unit 20 stops the count clock CK0 by supplying a count clock of 128 counts (7-bit count) from the start of a temporal change in the reference signal Vslop (the start of count time) to the count clock CK0 (t3). Simultaneously with this, the reference-signal generating unit 27 stops the generation of the reference signal Vslop. Consequently, the temporal change in the reference signal Vslop is also stopped.

Subsequently, during readout in the second time, the communication and timing control unit 20 reads out the signal component Vsig corresponding to an amount of incident light in each of the unit pixels 3 in addition to the reset level Srst and performs an operation same as that in the readout in the first time. First, the communication and timing control unit 20 controls the count-phase switching unit 253 using the count period control signal SEL. Then, the count-phase switching unit 253 sets a mode to output a signal in-phase with the comparison pulse COMP as the count enable signal EN (t4). After the readout in the second time from the unit pixels 3 in the arbitrary row Hx to the vertical signal line 19 is stabilized, the communication and timing control unit 20 supplies control data for generating the reference signal Vslop to the reference-signal generating unit 27.

In response to the supply of the control data, the reference-signal generating unit 27 inputs the reference signal Vslop changed with time in a ramp wave shape as a whole to the voltage comparing unit 252 (t5). The voltage comparing unit 252 compares the reference signal Vslop and the signal level Ssig. Simultaneously with the input of the reference signal Vslop to the voltage comparing unit 252, in order to measure comparison time in the voltage comparing unit 252 using the counter unit 254 arranged in each of the rows, the communication and timing control unit 20 inputs the count clock CK0 to the clock terminal of the counter unit 254 in synchronization with a change in the reference signal Vslop generated from the reference-signal generating unit 27. An initial value of a count operation in the second time is set to "−Drst", which is digital data of the reset level Srst of the unit pixels 3 acquired in the processing in the first time. In other words, count processing in the second time is continued from the count value obtained in the AD conversion processing in the first time in the up-count mode as in the count processing in the first time.

The voltage comparing unit 252 compares the reference signal Vslop and the signal level Ssig. The voltage comparing unit 252 inverts the comparison pulse COMP from the H level to the L level at a point when the reference signal Vslop and the signal level Ssig coincide with each other (t7). The voltage comparing unit 252 inputs the comparison pulse COMP to the count-phase switching unit 253. An inversion operation is performed according to the control by the count period control signal SEL. The count enable signal EN as an output of the count-phase switching unit 253 is inverted from the L level to the H level at the point when the reference signal Vslop and the signal level Ssig coincide with each other in the voltage comparing unit 252.

In response to a result of the inversion, the counter unit 254 counts, in the down-count mode same as that in the first time, time from a point when the comparison pulse COMP of the voltage comparing unit 252 is inverted until a point when the count clock CK0 is stopped, stores a count value at a point when the count processing is stopped, and finishes the AD conversion. The communication and timing control unit 20 stops the count clock CK0 by supplying a count clock for 1024 counts (10-bit count) from the start of the temporal change in the reference signal Vslop (the start of the count time) to the count clock CK0. Simultaneously with this, the reference-signal generating unit 27 stops the generation of the reference signal Vslop. Consequently, the temporal change in the reference signal Vslop is also stopped (t8).

In this example, the counter unit 254 performs the down-count using the comparison pulse COMP as the count enable signal EN in-phase during the readout in the first time using the comparison pulse COMP as the count enable signal EN anti-phase during the readout in the second time to thereby automatically perform subtraction indicated by Equation (7). A count value corresponding to a result of the subtraction is stored in the counter unit 254.

$$D2 = \text{initial value } Dini - (\text{count number in the first time}) - \quad (7)$$
$$(\text{count number in the second time})$$
$$= 1024 - Drst - (1024 - (Drst + Dsig))$$
$$= -Drst + (Drst + Dsig)$$
$$= Dsig$$

As it is evident from Equation (7), a subtraction expression in a third row of Equation (7) is identical with the subtraction expression in the second row of Equation (2) and the third row of Equation (4). Subtraction processing is performed between the reset level Srst and the signal level Ssig. According to the two times of count processing in the up-count mode for the reset level Srst and the signal level Ssig, a count value stored in the counter unit 254 is set to Dsig corresponding to the signal component Vsig.

As described above, according to the count processing in the down-count mode during the readout for the reset component ΔV in the first time and the count processing in the down-count mode during the readout for the signal component Vsig in the second time, subtraction processing for respective digital data of the signal level Ssig and the reset level Srst is performed in the counter unit 254. It is possible to remove the reset component ΔV including variation in each of the unit pixels 3 and an offset component in each of the column AD circuits 250. It is also possible to extract, with simple structure, only the digital data Dsig of the signal component Vsig corresponding to an amount of incident light in each of the unit pixels 3. In this case, there is an advantage that reset noise can also be removed.

Therefore, in the specific processing of the second example, as in the specific processing of the first example, the column processing unit 26 (specifically, the column AD circuit 250 in each of the columns) operates not only as a digital converter that converts an analog pixel signal into pixel digital data but also as a CDS processing function unit. In the specific processing of the second example, counters arranged column parallel only have to have the function of the down-count mode. Therefore, it is possible to eliminate a selector and the like used when the up-down counters are used, use a simple down-counter, and reduce a counter area.

Principle: Third Example

Figure 8:
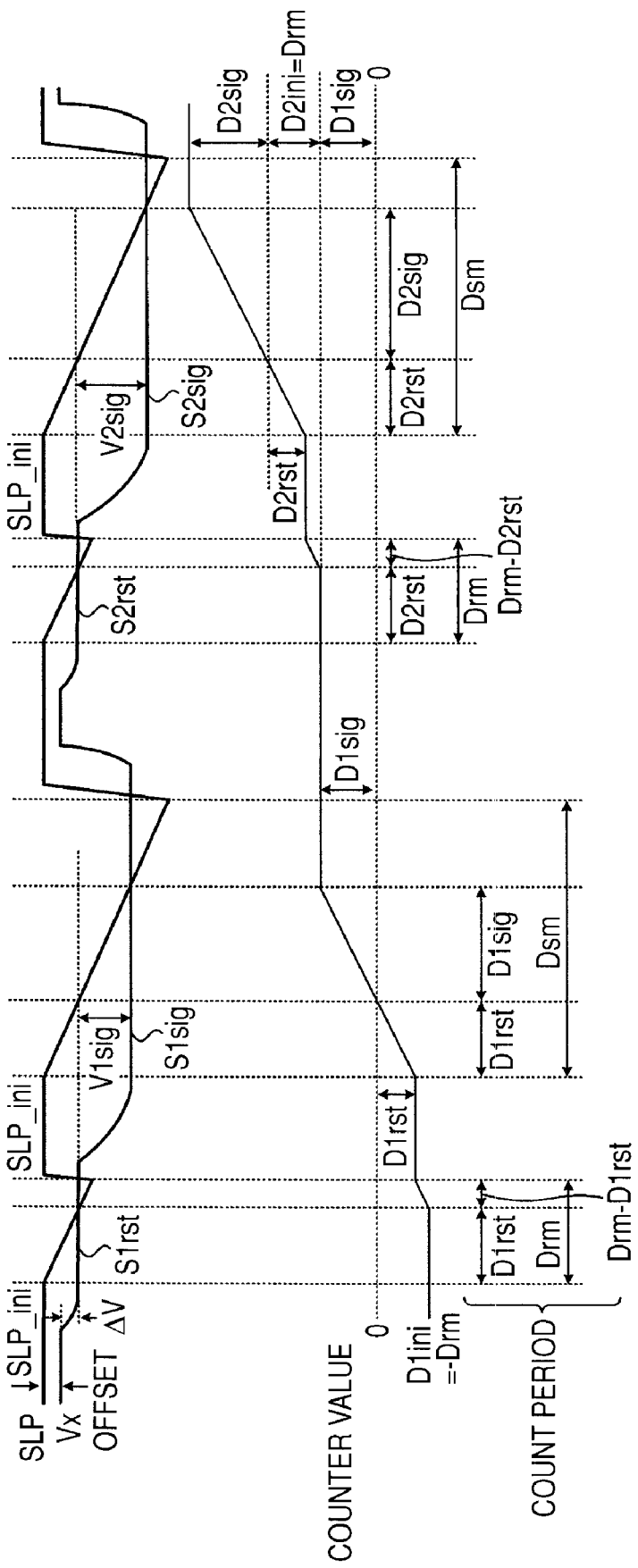
FIG. 8 is a diagram for explaining a third example of the operation principle of the column AD conversion processing according to the embodiment.

FIG. 8 is a diagram for explaining a third example of the operation principle of the column AD conversion processing according to this embodiment. The third example shown in FIG. 8 indicates an example in which digital data Dadd (=D1sig+D2sig) of an addition result of signal components Vsig for two pixels in an identical column for two rows is acquired. In the last part of the explanation concerning the operation principle of second example, the first example and the second example are summarized. As a significant characteristic of the AD conversion processing according to this embodiment, in one of count processing in the first time and count processing in the second time for one pixel, complement count processing is performed and, in the other, real number count processing is performed. In practice, the complement count processing is count processing in a negative direction and can be regarded as a subtraction element. The real number count processing is count processing in a positive direction and can be regarded as an addition element. This characteristic can be used for acquiring digital data of a multiply-accumulate result of plural pixels. However, as processing peculiar to this embodiment, it is necessary to pay attention to treatment of the initial value Dini corresponding to the implementation of the complement count processing.

In the operation principle of the third example, digital data Dadd (=D1sig+D2sig) of an addition result of signal components Vsig for two pixels is acquired by allocating count processing for the reset level Srst to the complement count processing and allocating count processing for the signal level Ssig to the real number count processing.

In this case, attention should be paid to treatment of initial values D1ini and D2ini corresponding to the implementation of respective kinds of complement count processing during count processing in the first time for respective pixels. It is necessary to start count processing from a processing result of a first pixel at least in processing of a second pixel. Therefore, during count processing in the first time for the second pixel, a negative number of a maximum count number Drm or a maximum number Dsm of the second pixel may be unable to be set as the initial value D2ini.

In FIG. 8, the first example of the operation principle is applied to perform processing for both two pixels in the up-count mode. In this case, concerning at least the maximum count number Drm of the second pixel (=D2ini), the digital arithmetic unit 29 is provided at the post stage of the counter unit 254 to subject the maximum count number Drm to a correction operation (in this example, subtraction). On the other hand, concerning the maximum count number Drm of the first pixel, a negative number of the maximum count number Drm of the first pixel can be set as the initial value D1ini during the count processing in the first time of the first pixel or the maximum count number Drm may be subjected to a correction operation (in this example, subtraction) by the digital arithmetic unit 29.

In FIG. 8, during AD conversion processing for a first pixel signal voltage Vx (the reset level Srst and the signal level Ssig), the initial value Dini is reset to a negative number of the maximum count number Drm corresponding to the maximum AD conversion period for the reset level Srst. Consequently, the count value D2 stored in the counter unit 254 when the count processing for the two pixels is completed is set to "D1sig+D2sig+Drm". It is possible to acquire digital data Dadd (=D1sig+D2sig) of an addition result of the signal components for the two pixels by subjecting the maximum count number Drm of the second pixel (=D2ini) to subtraction in the digital arithmetic unit 29.

In the processing for the two pixels, it is also possible to acquire digital data Dadd (=−D1sig −D2sig) of an addition result of signal components Vsig for the two pixels by allocating count processing for the reset level Srst to real number count processing and allocating count processing for the signal level Ssig to complement count processing. It is also possible to realize weighted addition by setting a tilt of the reference signal Vslop during AD conversion processing for the first pixel and a tilt of the reference signal Vslop during AD conversion processing for the second pixel different. It goes without saying that all coefficients during count processing may be positive or negative. Consequently, it is possible to realize filter processing that may not be able to be realized by the multiply-accumulate processing including the subtraction processing.

For example, it is possible to output digital data Dadd (=D1sig+D2sig) obtained by adding up signal components of the unit pixels 3 in two rows of ith row and i+1th row. By repeating the same operation, it is possible to obtain an image formed by curtailing pixel information to a half in a vertical direction (a vertical (column) direction on a sensor surface). As a result, it is possible to double a frame rate compared with that in a normal frame rate mode for reading out all pieces of pixel information.

From the viewpoint of the number of pieces of read-out pixel information, the readout of the pixel information is the same as curtailing the pixel information to a half in the vertical direction and reading out (skipping and reading out) the pixel information. However, since the pixel information is added between two pixels in the vertical direction, from the viewpoint of an amount of information of one piece of pixel information, the amount of information is doubled. Therefore, even if exposure time of the unit pixels 3 is set to a half in an attempt to, for example, double the frame rate, since digital values are added up between unit pixels for two rows in AD conversion, the amount of information of one piece of pixel information is doubled. Therefore, sensitivity does not fall compared with that at the normal frame rate. Even if the exposure time of the unit pixels 3 is reduced, as a result, the amount of information of one piece of pixel information is not reduced. Therefore, it is possible to realize an increase in a frame rate without causing the fall in sensitivity.

In FIG. 8, processing for both the two pixels is performed in the up-count mode. However, processing for both the two pixels may be performed in the down-count mode by applying the second example of the operation principle. In this case, concerning at least the maximum count number Dsm of the second pixel, the digital arithmetic unit 29 is provided at the post stage of the counter unit 254 to subject the maximum count number Dsm to a correction operation. On the other hand, concerning the maximum count number Dsm of the first pixel, the maximum count number Dsm of the first pixel can be set as the initial value D1ini during the count processing in the first time of the first pixel or the maximum count number Dsm may be subjected to a correction operation by the digital arithmetic unit 29.

In the example explained above, the addition data Dadd for the pixel signal voltage Vx for the two pixels is acquired.

However, it is also possible to acquire digital data of an addition and subtraction processing result (e.g., order is addition, subtraction, and addition) of arbitrary four kinds of processing object signals by using this mechanism. In this case, as in the example, complement count processing is allocated to a subtraction element (including a first complement element) and real number count processing is allocated to an addition element.

The addition processing for the two pixels is explained above. However, it is possible to acquire digital data Dadd of an addition result (a sign is positive or negative) of signal components Vsig for three or more pixels by applying the same idea to three or more pixel signal voltages Vx. For example, smoothing filter processing can be realized by setting all coefficients of processing object pixel signals the same. Weighted addition processing for highlighting a center pixel can be realized if a coefficient of the center pixel is set larger than coefficients of peripheral pixels.

Principle: Fourth Example

Figure 9:
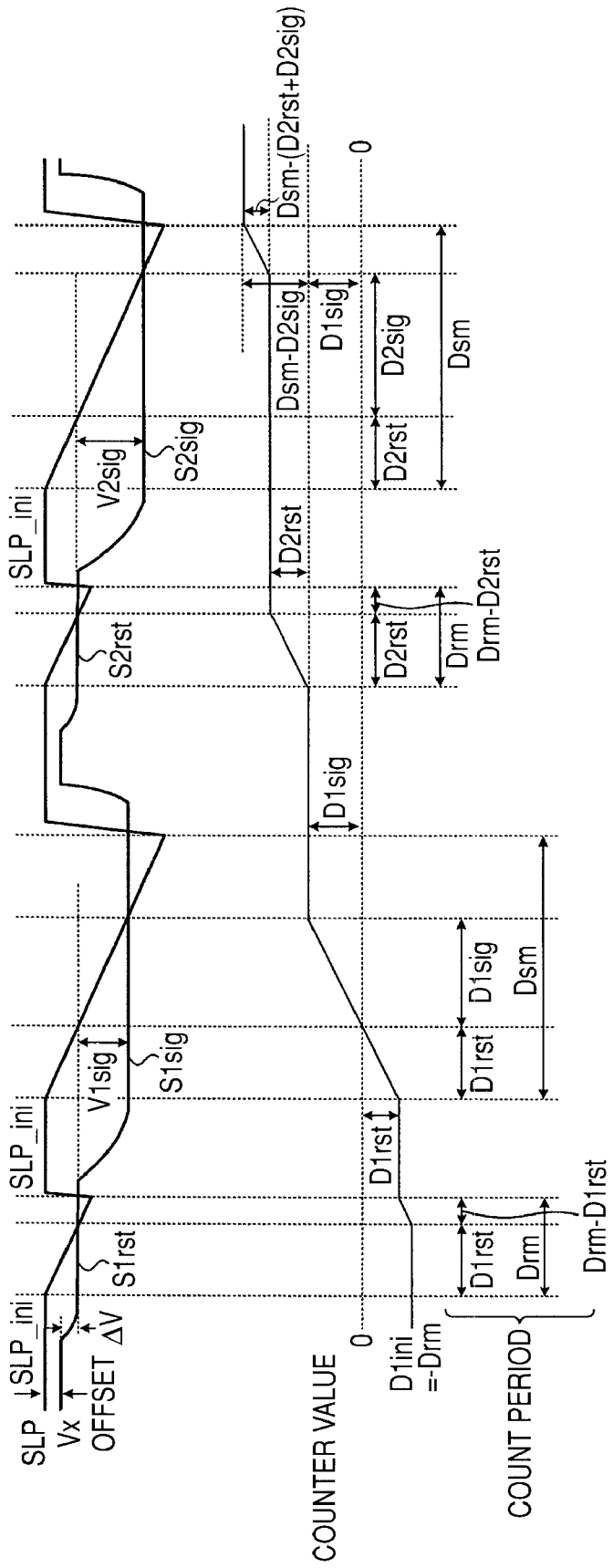
FIG. 9 is a diagram for explaining a fourth example of the operation principle of the column AD conversion processing according to the embodiment.

FIG. 9 is a diagram for explaining a fourth example of the operation principle of the column AD conversion processing according to this embodiment. The fourth example shown in FIG. 9 indicates an example in which digital data Dsub of a subtraction result of signal components Vsig for two pixels in an identical column for two rows is acquired.

In the operation principle of the fourth example, in processing for two pixels, digital data Dsub (=D1sig−D2sig or D2sig−D1sig) of a subtraction result of signal components Vsig for two pixels is acquired by allocating count processing for the reset level Srst of one of the pixels and count processing for the signal level Ssig to complement count processing and real number count processing, respectively, and allocating count processing for the reset level Srst of the other and count processing for the signal level Ssig to real number count processing and complement count processing, respectively.

In this case, attention should be paid to treatment of initial values D1ini and D2ini corresponding to the implementation of respective kinds of complement count processing during count processing in the first time for respective pixels. It is necessary to start count processing from a processing result of a first pixel at least in processing of a second pixel. Therefore, during count processing in the first time for the second pixel, a negative number of a maximum count number Drm or a maximum count number Dsm of the second pixel may not be able to be set as the initial value D2ini.

In FIG. 9, the first example of the operation principle is applied to perform processing for both two pixels in the up-count mode. Digital data Dsub (=D1sig−D2sig) of a subtraction result of the signal components Vsig for the two pixels is acquired by allocating count processing for the first reset level Srst and count processing of the signal level Ssig to complement count processing and real number count processing, respectively, and allocating count processing for the second reset level Srst and count processing for the signal level Ssig to real number count processing and complement count processing, respectively.

In this case, concerning at least the maximum count number Dsm of the second pixel, the digital arithmetic unit 29 is provided at the post stage of the counter unit 254 to subject the maximum count number Drm to a correction operation (in this example, subtraction). On the other hand, concerning the maximum count number Drm of the first pixel, a negative number of the maximum count number Drm of the first pixel can be set as the initial value D1ini during the count processing in the first time of the first pixel or the maximum count number Drm may be subjected to a correction operation (in this example, subtraction) by the digital arithmetic unit 29.

In FIG. 9, during AD conversion processing for the first pixel signal voltage Vx (the reset level Srst and the signal level Ssig), the initial value Dini is reset to a negative number of the maximum count number Drm corresponding to the maximum AD conversion period for the reset level Srst. Consequently, the count value D2 stored in the counter unit 254 when count processing for the two pixels is completed is set to "D1sig−D2sig+Dsm". It is possible to acquire digital data Dsub (=D1sig−D2sig) of a subtraction result of the signal components for the two pixels by subjecting the maximum count number Dsm of the second pixel (=D2ini) to subtraction in the digital arithmetic unit 29.

In the processing for the two pixels, it is also possible to acquire digital data Dsub (=−D1sig+D2sig) of a subtraction result of signal components Vsig for the two pixels by allocating count processing for the first reset level Srst and count processing for the signal level Ssig to real number count processing and complement count processing, respectively, and allocating count processing for the second reset level Srst and count processing for the signal level Ssig to complement count processing and real number count processing, respectively. It is also possible to realize weighted subtraction by setting a tilt of the reference signal Vslop during AD conversion processing for the first pixel and a tilt of the reference signal Vslop during AD conversion processing for the second pixel different.

It is possible to acquire a difference image by realizing subtraction processing for every two rows. As a form of use of the difference processing, it is possible to realize a function of edge extraction processing without using a special circuit on the outside of the column processing unit 26. When the difference processing is performed in a column direction by the counter unit 254, subtraction is performed for every two rows, i.e., between pixels adjacent to each other in a vertical scanning direction and it is possible to perform edge detection. When an operation for performing subtraction of the pixels adjacent to each other in the vertical scanning direction, signal intensity is the highest in a boundary of white and black in a scanning direction in a subject. In other words, an output is not obtained in the difference image in a portion where a signal level is fixed in a charge generating unit such as a photodiode but a difference output is obtained in a boundary portion where the signal level changes. Therefore, it is possible to perform edge detection. It is possible to realize linear detection processing in a horizontal matrix direction by applying the edge detection processing in the vertical direction to plural vertical columns.

The difference processing can also be used as pattern matching processing. Pattern matching can be processing in a concept same as that of edge detection. For example, when scanning is performed by using a combination of subtraction patterns same as a pattern to be extracted, a most intense signal is obtained from a portion of a pattern same as the combination of subtraction patterns. This is the same as operation through a one-dimensional spatial filter.

When a subtraction processing function in a row direction (a horizontal direction) is given to the digital arithmetic unit 29, two-dimensional processing can be performed. It is possible to realize, for example, a highly accurate pattern recognition function by making it possible to perform difference arithmetic processing not only in the column direction but also in the row direction.

In FIG. 9, processing for both the two pixels is performed in the up-count mode. However, processing for the two pixels may be performed in the down-count mode by applying the second example of the operation principle. In this case, concerning at least the maximum count number Dsm of the second pixel, the digital arithmetic unit 29 is provided at the post stage of the counter unit 254 to subject the maximum count number Dsm to a correction operation. On the other hand, concerning the maximum count number Dsm of the first pixel, the maximum count number Dsm of the first pixel can be set as the initial value D1ini during the count processing in the first time of the first pixel or the maximum count number Drm may be subjected to a correction operation by the digital arithmetic unit 29.

In the example explained above, the subtraction data Dsub for the pixel signal voltage Vx for the two pixels is acquired. However, it is also possible to acquire digital data of an addition and subtraction processing result (e.g., order is addition, addition, and subtraction) of arbitrary four kinds of processing object signals by using this mechanism. In this case, as in the example, complement count processing is allocated to a subtraction element (including a first complement element) and real number count processing is allocated to an addition element.

The subtraction processing for the two pixels is explained above. However, it is possible to acquire digital data D of an addition and subtraction result of signal components Vsig for three or more pixels by applying the same idea to three or more pixel signal voltages Vx. For example, a function of one-dimensional spatial filter processing in the vertical direction can be realized. For example, by setting coefficients as "1, −2, 1" or "1, −3, 1", a spatial filter for highlighting a center pixel can be realized. Alternatively, by setting coefficients as "−1, 2, −1" or "−1, 3, −1", a spatial filter for highlighting a center pixel having a characteristic opposite to the above can be realized.

It is also possible to stop count processing for a specific pixel and set a coefficient to "0". Therefore, for example, by setting coefficients as "−1, 0, 1" or "1, 0, −1", it is also possible to realize a differential filter in the vertical column direction.

Consequently, it is also possible to realize discrete cosine conversion frequently used in image compression processing. In the discrete cosine conversion, it is necessary to calculate a sum by multiplying, for example, 8×8 pixels with a cosine coefficient and the cosine coefficient has a sign. Therefore, when such a bipolar arithmetic operation is necessary, it is possible to easily realize a requested function by performing processing as a combination of addition and subtraction.

Details of the Count-Phase Switching Unit

Figure 11A:
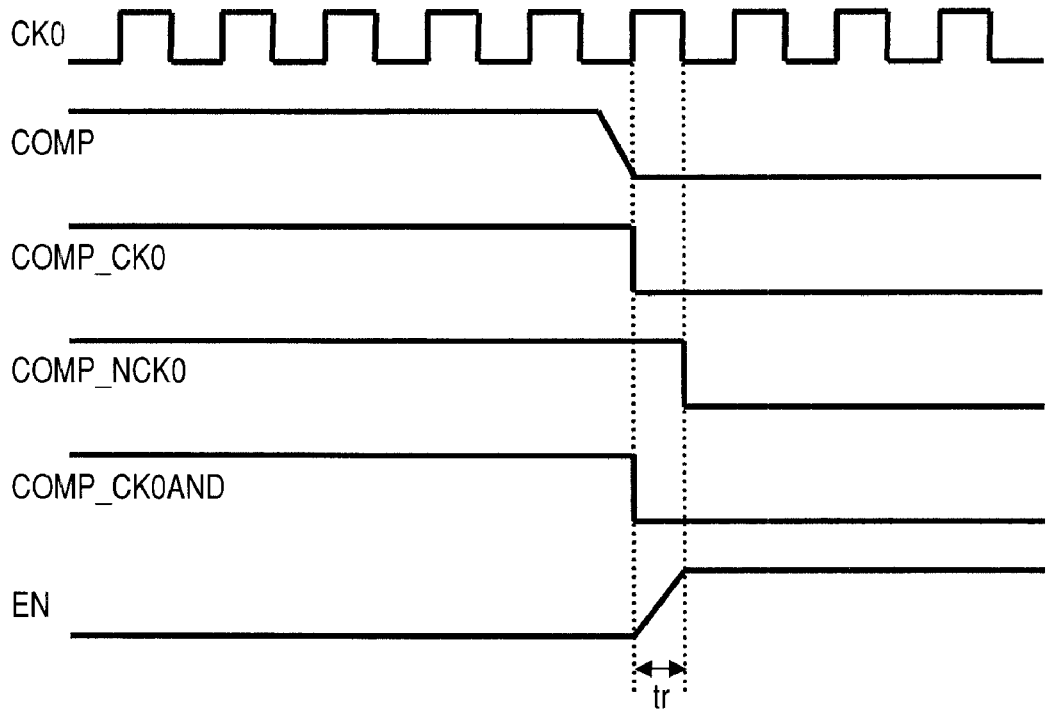
FIGS. 11A and 11B are timing charts for explaining an operation of the count-phase switching unit shown in FIG. 10.
Figure 11B:
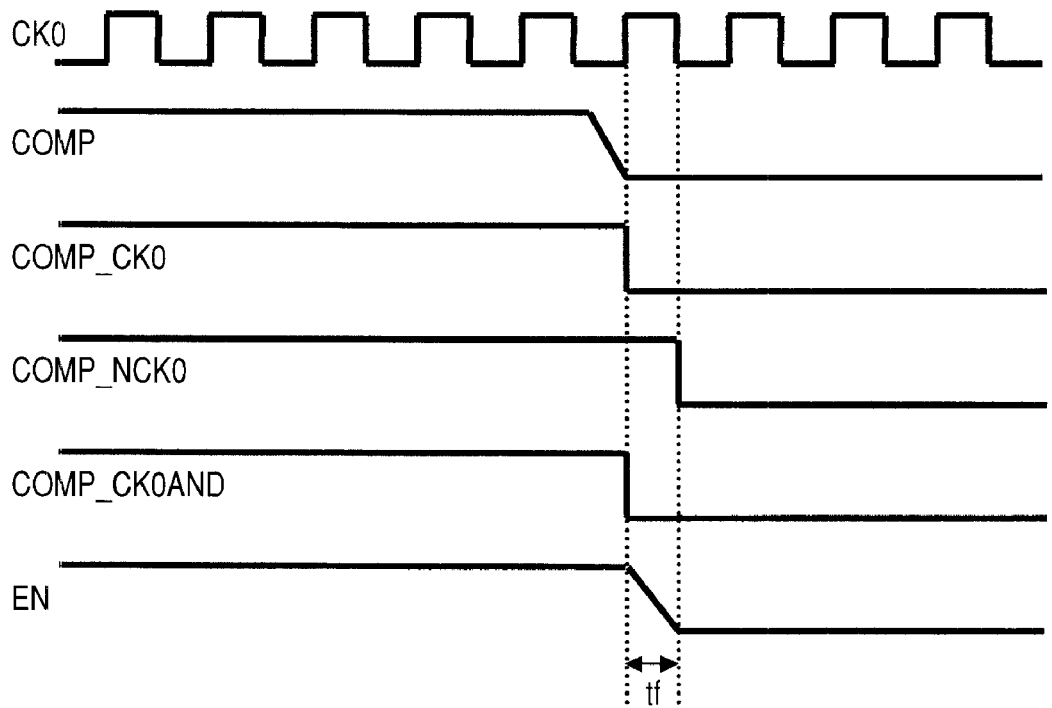

FIGS. 10 and 11 are diagrams for explaining an example of the detailed structure of the count-phase switching unit 253, which is an example of the count-period control unit. FIG. 10 is a diagram showing an example of a circuit configuration of the count-phase switching unit 253 and FIGS. 11A and 11B are timing charts for explaining an operation of the count-phase switching unit 253.

In the above explanation, as an example of the structure of the count-phase switching unit 253, between the voltage comparing unit 252 and the counter unit 254, in order to switch a count phase to the P phase and the D phase, the EX-OR gate is used as a polarity inversion element that has a function of deciding whether the comparison pulse COMP should be logically inverted. The comparison pulse COMP is inputted to one input terminal of the EX-OR gate and the count period control signal SEL is inputted to the other input terminal thereof.

When the count phase to the P phase and the D phase, since a polarity of the count enable signal EN is inverted in the P phase and the D phase, a difference occurs in paths in the P phase and the D phase. When the difference in the paths in the P phase and the D phase varies in each of the columns, it is likely that the difference appear as a vertical stream in an image.

Examples of a cause of the difference in the paths in the P phase and the D phase include a difference between transistors Tr to be turned on and off in the P phase and the D phase of an inverting circuit forming the polarity inversion element (as a simple example, the EX-OR gate) and an influence due to a delay caused by variation in a parasitic element such as a wiring resistor. When this variation is large, it is likely that inversion timing of the count enable signal EN in the P phase and the D phase substantially changes. As speed of the count clock CK0 increases, it is more difficult to guarantee a delay in the comparison pulse COMP for each of the columns (e.g., within 1 CLK of CK0). As a result, vertical stream noise between the columns exceeds 1 LSB.

As measures against the problem, in the count-phase switching unit 253 shown in FIG. 10, a mechanism for synchronizing the comparison pulse COMP in the count clock CK0 immediately before inversion is adopted in order to limit the influence due to variation within 1 CLK of the count clock CK0 and suppress CDS error factors to only a difference between a rising period tr and a falling period tf of the polarity inversion element (as a simple example, the EX-OR gate). The structure and operations of the count-phase switching unit 253 are explained below with reference to FIGS. 11A and 11B.

As shown in FIG. 10, the count-phase switching unit 253 includes a cascade circuit of inverters 302 and 304 that logically invert the count clock CK0, two D-type flip-flops (D-FFs) 312 and 314, an AND gate 322 of a two-input type, and an EX-OR gate 324.

The D-type flip-flop 312 latches the comparison pulse COMP supplied to a D input terminal at a rising edge of a count clock NCK0 (practically, a falling edge of the count clock CK0), which is an output of the inverter 302 and supplies the comparison pulse COMP to one input terminal of the AND gate 322 as a comparison pulse COMP_NCK0.

The D-type flip-flop 314 latches the comparison pulse COMP supplied to a D input terminal at a rising edge of the count clock CK0, which is an output of the inverter 304, and supplies the comparison pulse COMP to the other input terminal of the AND gate 322 as a comparison pulse COMP_CK0.

The AND gate 322 calculates a logical product of the comparison pulse COMP_NCK0 supplied from the D-type flip-flop 312 and the comparison pulse COMP_CK0 supplied from the D-type flip-flop 314 and supplies the logical product to one input terminal of the EX-OR gate 324 as a comparison pulse COM_CK0AND.

The count period control signal SEL, which is at H (=1) in the P phase and at L (=0) in the D phase, is supplied to the other input terminal of the EX-OR gate 324. Consequently, in the P phase, the EX-OR gate 324 logically inverts the comparison pulse COMP_CK0AND supplied from the AND gate 322. In the D phase, the EX-OR gate 324 directly outputs the comparison pulse COMP_CK0AND supplied from the AND gate 322 as the count enable signal EN.

Paths of the comparison pulse COMP are equal before CLK synchronization in the P phase and the D phase (i.e., up to the D input terminals of the D-type flip-flops 312 and 314). The comparison pulse COMP is synchronized by the D-type flip-flops 312 and 314 using the count clock CK0 and the count clock NCK0 delayed by a half clock, a logical product of the comparison pulse COMP is calculated by the AND gate 322, and the logical product is supplied to the EX-OR gate 324 as the comparison pulse COMP_CK0AND. Therefore, variation in the count enable signal EN can be defined only by a delay of the EX-OR gate 324.

Consequently, the count enable signal EN based on the comparison pulse COMP can be synchronized by the count clock CK0. Even if there is variation in the comparison pulse COMP, in the count enable signal EN, the variation can be limited to within 1 CLK of the count clock CK0. As a result, the CDS error factor can be suppressed to only a difference between tr and tf of the polarity inversion element (the EX-OR gate 324). This is because, if the CDS error is within 0.5 CLK when a delay (tr−tf) of the EX-OR gate 324 is DDR, a vertical stream between columns can be suppressed to be equal to or lower than 1 LSB (see FIGS. 11A and 11B).

When the count-phase switching unit 253 that synchronizes the count enable signal EN using the count clock CK0 is not adopted (e.g., the comparison pulse COMP is directly inputted to the EX-OR gate 324), a delay in the comparison pulse COMP substantially affects a switch SW of the transistor Tr of the EX-OR gate 324. It is likely that inversion timing of the count enable signal EN in the P phase and the D phase substantially changes because of the delay in the comparison pulse COMP. As speed of the count clock CK0 increases, it is more difficult to guarantee the delay in the comparison pulse COMP for each of the columns (e.g., within 1 CLK).

On the other hand, in the example of the circuit shown in FIG. 10, the count-phase switching unit 253 that synchronizes the count enable signal EN using the count clock CK0 is adopted. In other words, the comparison pulse COMP from the voltage comparing unit 252 is synchronized by the count clock CK0 used for count processing in the counter unit 254. The EX-OR gate 324 generates the count enable signal EN on the basis of the synchronized comparison pulse (the comparison pulse COMP_CK0AND supplied from the AND gate 322) to determine respective count periods of a subtraction element and an addition element.

In this case, paths of the D phase and the P phase are the same up to immediately before the D-type flip-flops 312 and 314. Therefore, by synchronizing the comparison pulse COMP using the count clock CK0 immediately before inversion by the EX-OR gate 324, it is possible to suppress the delay to be within 1 CLK at the maximum.

As a result, when the delay difference (tr−tf) of the P phase and the D phase due to the comparison pulse COMP_CK0AND and the EX-OR gate 324 is within 1 CLK1, it is possible to suppress a vertical stream between columns to be within 1 LSB. By synchronizing the comparison pulse COMP that defines the count enable signal EN using the count clock CK0, it is possible to suppress the vertical stream between columns.

Imaging Apparatus

Figure 12:
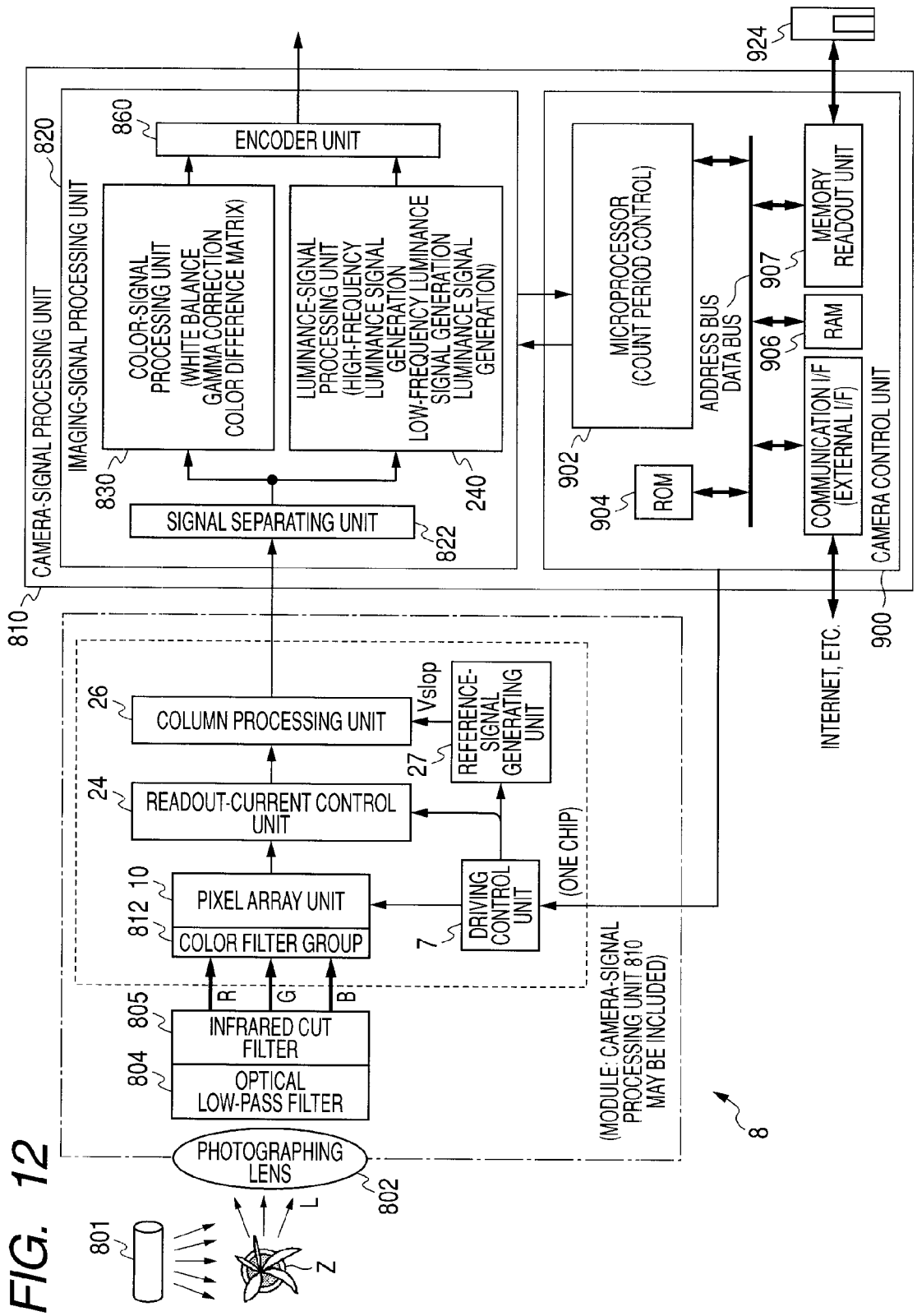
FIG. 12 is a diagram showing a schematic structure of an imaging apparatus that is an example of a physical information acquiring apparatus employing a mechanism same as that of the solid-state imaging device.

FIG. 12 is a diagram showing the schematic structure of an imaging apparatus that is an example of a physical information acquiring apparatus employing a mechanism same as that of the solid-state imaging device 1. An imaging apparatus 8 shown in FIG. 12 is an imaging apparatus that obtains a visible light color image.

The mechanism of the solid-state imaging device 1 described above is applicable not only to a solid-state imaging device but also to an imaging apparatus. In this case, when the imaging apparatus adopts an AD conversion system of a reference signal comparison type, it is possible to realize a mechanism that can perform multiple-accumulate simultaneously with AD conversion while controlling an increase in a circuit area (in particular, the column AD circuit 250).

In this case, for control of generation of the reference signals Vslop for executing the AD conversion of the reference signal comparison type, control of a tilt (the number of LSB steps per one count) of the reference signal Vslop, or control of a count period, a main control unit on the outside can arbitrarily designate, through data setting in the communication and timing control unit 20, a mode switching instruction.

Specifically, an imaging apparatus 8 includes a photographing lens 802 that guides light L, which bears an image of a subject Z present below an illumination device 801 such as a fluorescent lamp, to the imaging apparatus side and focuses the light L, an optical low-pass filter 804, a group of color filers 812 in which color filters of, for example, R, G, and B are arranged in a Bayer array, the pixel array unit 10, the driving control unit 7 that drives the pixel array unit 10, the readout-current control unit 24 that controls an operation current of a pixel signal outputted from the pixel array unit 10, the column processing unit 26 that applies CDS processing, AD conversion processing, and the like to the pixel signal outputted from the pixel array unit 10, the reference-signal generating unit 27 that supplies the reference signal Vslop to the column processing unit 26, and a camera-signal processing unit 810 that processes an imaging signal outputted from the column processing unit 26.

The optical low-pass filter 804 is a filter for blocking a high-frequency component equal to or higher than the Nyquist frequency in order to prevent aliasing. As indicated by a dotted line in the figure, it is also possible to provide, together with the optical low-pass filter 804, an infrared cut filter 805 that reduces an infrared component. In this regard, the imaging apparatus 8 is the same as a general imaging apparatus.

The camera-signal processing unit 810 provided at a post stage of the column processing unit 26 includes an imaging-signal processing unit 820 and a camera control unit 900 that functions as a main control unit that controls the entire imaging apparatus 8.

The imaging-signal processing unit 820 includes a signal separating unit 822 that has a primary color separation function for separating, when a filter other than a primary color filter is used as a color filter, a digital imaging signal supplied from an AD conversion function unit of the column processing unit 26 into primary color signals of R (red), G (green), and B (blue) and a color-signal processing unit 830 that performs signal processing for a color signal C on the basis of the primary color signals R, G, and B separated by the signal separating unit 822.

The imaging-signal processing unit 820 includes a luminance-signal processing unit 840 that performs signal processing for a luminance signal Y on the basis of the primary color signals R, G, and B separated by the signal separating unit 822 and an encoder unit 860 that generates a video signal VD on the basis of the luminance signal Y and the color signal C.

Although not shown in the figure, the color-signal processing unit 830 includes, for example, a white balance amplifier, a gamma correction unit, and a color difference matrix unit. The white balance amplifier adjusts, on the basis of again signal supplied from a not-shown white balance controller, a gain of a primary color signal supplied from a primary color separation function unit of the signal separating unit 822 (white balance adjustment) and supplies the primary color signal to the gamma correction unit and the luminance-signal processing unit 840.

The gamma correction unit performs gamma (γ) correction for faithful color reproduction on the basis of the primary color signal, a white balance of which is adjusted, and inputs output signals R, G, and B for the respective colors subjected to gamma correction to the color difference matrix unit. The color difference matrix unit inputs color difference signals R-Y and B-Y obtained by performing color difference matrix processing to the encoder unit 860.

Although not shown in the figure, the luminance-signal processing unit 840 includes, for example, a high-frequency luminance-signal generating unit that generates a luminance signal YH including a relatively high frequency component on the basis of a primary color signal supplied from the primary color separation function unit of the signal separating unit 822, a low-frequency luminance-signal generating unit that generates a luminance signal YL including only a relatively low frequency component on the basis of a primary color signal, white balance of which is adjusted, supplied from the white balance amplifier, and a luminance-signal generating unit that generates a luminance signal Y on the basis of the two kinds of luminance signals YH and YL and supplies the luminance signal Y to the encoder unit 860.

After subjecting the color difference signals R-Y and B-Y to digital modulation with a digital signal corresponding to a color signal sub-carrier wave, the encoder unit 860 combines the color difference signals R-Y and B-Y with the luminance signal Y generated by the luminance-signal processing unit 840 and converts the combined signal into a digital video signal VD (=Y+S+C; S is a synchronization signal and C is a chroma signal).

The digital video signal VD outputted from the encoder unit 860 is supplied to a not-shown camera-signal output unit further at a post stage and served for monitor output, data recording in a recording medium, and the like. In this case, when necessary, the digital video signal VD is converted into an analog video signal V by DA conversion.

The camera control unit 900 according to this embodiment includes a microprocessor 902 in the center of a computer represented by a CPU (Central Processing Unit) in which functions of arithmetic operations and control performed by a computer are integrated in a very small integrated circuit, a ROM (Read Only Memory) 904 as a read-only storing unit, a RAM (Random Access Memory) 906 that is an example of a randomly writable and readable and volatile storing unit, and not-shown other peripheral members. The microprocessor 902, the ROM 904, and the RAM 906 are collectively referred to as a microcomputer.

In the above description, "volatile storing unit" means a storing unit of a form that deletes stored content when a power supply of the apparatus is turned off. On the other hand, "nonvolatile storing unit" means a storing unit of a form that continues to store stored content even when a main power supply of the apparatus is turned off. The storing unit only has to be capable of continuing to store stored content and is not limited to a storing unit in which a memory element itself made of semiconductor has nonvolatility. The storing unit may be a storing unit in which a volatile memory element is given "nonvolatility" by a backup power supply.

The storing unit is not limited to be formed by the memory element made of semiconductor and may be formed by using media such as a magnetic disk and an optical disk. For example, a hard disk device can be used as the nonvolatile storing unit. A storing unit that reads out information from a storage medium such as a CD-ROM can also be used as the nonvolatile storing unit.

The camera control unit 900 controls the entire system. In particular, in a relation with the multiply-accumulate in adopting the AD conversion system of the reference signal comparison type, the camera control unit 900 has a function of adjusting ON/OFF timing and setting values of various control pulses for controlling generation of the reference signal Vslop, controlling a tilt (the number of LSB steps per one count) of the reference signal Vslop, and controlling a count period.

A control program for the camera control unit 900 and the like are stored in the ROM 904. In particular, in this example, a program for setting ON/OFF timing of various control pulses with the camera control unit 900 is stored in the ROM 904. Data and the like with which the camera control unit 900 performs various kinds of processing are stored in the RAM 906.

A recording medium 924 such as a memory card is detachably insertable into the camera control unit 900. The camera control unit 900 can be connected to a communication network such as the Internet. For example, the camera control unit 900 includes a memory readout unit 907 and a communication I/F (interface) 908 other than the microprocessor 902, the ROM 904, and the RAM 906.

The recording medium 924 is used for, for example, registering program data for causing the microprocessor 902 to perform software processing and data such as various setting values including a converging range of photometry data DL based on a luminance signal from the luminance-signal processing unit 840 and ON/OFF timing of various control pulses and setting values for exposure control processing (including electronic shutter control) and multiply-accumulate in adopting the AD conversion system of the reference signal comparison type.

The memory readout unit 907 stores data read out from the recording medium 924 in the RAM 906. The communication I/F 908 mediates exchange of communication data between a communication network such as the Internet and the apparatus.

In such an imaging apparatus 8, the driving control unit 7 and the column processing unit 26 are shown as a module separately from the pixel array unit 10. However, as described about the solid-state imaging device 1, it goes without saying that the solid-state imaging device 1 as one chip in which these units are integrally formed on a semiconductor substrate identical with a semiconductor substrate on which the pixel array unit 10 is formed may be used.

In the figure, the imaging apparatus 8 is shown in a state including optical systems such as the photographing lens 802, the optical low-pass filter 804, and the infrared cut filter 805 other than the pixel array unit 10, the driving control unit 7, the column processing unit 26, the reference-signal generating unit 27, and the camera-signal processing unit 810. This form is suitable when a module-like form having an imaging function in which these units are collectively packaged is adopted.

In a relation with the module in the solid-state imaging device 1, as shown in the figure, the solid-state imaging device 1 is provided in a module-like form that has an imaging function in a state in which the pixel array unit 10 (the imaging unit) and signal processing units (excluding the camera-signal processing unit at the post stage of the column processing unit 26) closely related to the pixel array unit 10 side such as the column processing unit 26 having an AD conversion function and a difference (CDS) processing function are collectively packaged. The entire imaging apparatus 8 may be configured by providing the camera-signal processing unit 810, which is the remaining signal processing unit, at the post stage of the solid-state imaging device 1 provided in the module-like form.

Alternatively, although not shown in the figure, the solid-state imaging device 1 is provided in a module-like form that has an imaging function in a state in which the pixel array unit 10 and the optical systems such as the photographing lens 802 are collectively packaged. The entire imaging apparatus 8 may be configured by providing the camera-signal processing unit 810 in the module in addition to the solid-state imaging device 1 provided in the module-like form.

As a form of the module in the solid-state imaging device 1, the camera-signal processing unit 810 equivalent to the camera-signal processing unit 200 may be included. In this case, in practice, the solid-state imaging device 1 and the imaging apparatus 8 can be regarded identical.

Such an imaging apparatus 8 is provided as a portable apparatus for performing "imaging" that has, for example, a camera and an imaging function. "Imaging" includes not only capturing of an image during normal camera photographing but also fingerprint detection and the like in a broader sense.

The imaging apparatus 8 having such structure includes all the functions of the solid-state imaging device 1. Basic components and operations can be the same as those of the solid-state imaging device 1. When the AD conversion system of the reference signal comparison type is adopted, it is possible to realize a mechanism that can perform multiply-accumulate simultaneously with AD conversion while controlling an increase in an area of the column AD circuit 250.

For example, a program for causing a computer to execute the processing described above is distributed through the recording medium 924 including a nonvolatile semiconductor memory card such as a flash memory, an IC card, or a miniature card. Moreover, the program may be downloaded from a server or the like through a communication network such as the Internet and acquired or updated.

In the semiconductor memory such as the IC card or the miniature card as an example of the recording medium 924, it is possible to store a part or all of the functions of the processing in the solid-state imaging device 1 (in particular, the functions related to simultaneous execution of multiply-accumulate processing and AD conversion in adopting the AD conversion system of the reference signal comparison type) explained in the embodiments. Therefore, it is possible to provide a program and a storage medium having the program stored therein. For example, a program for AD conversion with a multiply-accumulate function for performing setting of the number of generated reference signals Vslop or pixel signal voltage Vx or a tilt (the number of LSB steps per one count) of the reference signal Vslop and control of a count period, i.e., software installed in the RAM 906 or the like includes, as software, a function of setting a control pulse and other setting values for simultaneously performing multiply-accumulate and AD conversion in the same manner as the AD conversion system of the reference signal comparison type explained about the solid-state imaging device 1.

The software is readout to the RAM 906 and, then, executed by the microprocessor 902. For example, the microprocessor 902 executes setting processing on the basis of the program stored in the ROM 904 and the RAM 906 as examples of the recording medium and performs setting of the number of generated reference signals Vslop or a tilt (the number of LSB steps per one count) of the reference signal Vslop and control of a count period performed by using the comparison pulse COMP. Consequently, when the AD conversion system of the reference signal comparison type is adopted, it is possible to realize, in terms of software, a function of simultaneously performing multiply-accumulate and AD conversion while controlling an increase in a circuit area.

The present invention has been explained with reference to the embodiments. However, the technical scope of the present invention is not limited to the range described in the embodiments. It is possible to apply various modifications or improvements to the embodiments without departing from the spirit of the present invention. Forms applied with such modifications or improvements are also included in the present invention.

The embodiments do not limit to the inventions according to claims. All combinations of the characteristics explained in the embodiments are not always indispensable for means for resolution of the present invention. Inventions at various stages are included in the embodiments. Various inventions can be extracted according to appropriate combinations of the disclosed plural elements. As long as the effects can be obtained even if several elements are deleted from all the elements described in the embodiments, a configuration in which the several elements are deleted can be extracted as an invention.

Application to an Electronic Device

In the example explained above, the AD converter (the AD conversion device; in the example, the column AD circuit) including the comparing unit that compares an electric signal corresponding to a processing object signal and a reference signal for AD conversion and the counter unit that performs count processing in any one of the down-count mode and the up-count mode in parallel with comparison processing in the comparing unit and stores a count value at a point when the comparison processing in the comparing unit is completed is applied to the solid-state imaging device as the data processing device. However, a mechanism of the AD converter and the data processing device can be applied not only to the solid-stage imaging device but also to all kinds of electronic devices that needs a mechanism of data processing for acquiring digital data of a multiply-accumulate result among plural signals having an identical physical characteristic.

The AD converter (the AD conversion device) is not limited to be incorporated in the solid-state imaging device and other electronic devices and provided. The AD converter may be provided as an independent device such as an IC (Integrated Circuit) and an AD conversion module.

In this case, the AD converter may be provided as the AD conversion device including the comparing unit and the counter unit. However, the AD converter may be incorporated in a module including a combination of an IC and an individual chip in which a reference-signal generating unit that generates a reference signal for AD conversion and supplies the reference signal to the comparing unit and a control unit that switches a mode of count processing in the counter unit according to which of a reference component and a signal component the comparing unit applies the comparison processing to are arranged on a semiconductor substrate identical with a semiconductor substrate on which the comparing unit and the counter unit are arranged.

By incorporating these units in the AD converter and providing the AD converter, it is possible to collectively treat the functional units necessary for controlling operations of the comparing unit and the counter unit and it is easy to treat and manage the members. Since the elements necessary for AD conversion processing are collected (integrated) as the IC and the module, it is also easy to manufacture finished products such as the solid-state imaging device and other electronic devices.

It should be understood by those skilled in the art that various modifications, combinations, sub-combinations, and alterations may occur depending on design requirements and other factors insofar as they are within the scope of the appended claims or the equivalents thereof.

What is claimed is:

1. A data processing method for acquiring digital data of a multiply-accumulate result of plural processing object signals by comparing, for each of the plural processing object signals, a reference signal, which gradually changes, for converting the processing object signal into digital data and the processing object signal, performing count processing in a designated count period in parallel to the comparison processing, and storing a count value at a point when the comparison processing is completed, the data processing method comprising the steps of:

performing, during the count processing for a processing object signal of a subtraction element, the count processing in a period from a point when the processing object signal and the reference signal coincide with each other until a point when the reference signal reaches a predetermined end value;

performing, during the count processing for a processing object signal of an addition element, the count processing in a period from a point when the reference signal is a predetermined initial value until a point when the processing object signal and the reference signal coincide with each other;

applying the count processing to both the subtraction element and the addition element in an identical mode of any one of an up-count mode and a down-count mode;

starting, during the count processing for a following processing object signal, the count processing using a count value stored in the count processing for a preceding processing object signal as an initial value; and correcting the digital data of the multiply-accumulate result to digital data in which a count value corresponding to a period in which the reference signal in the count processing for the processing object signal of the subtraction element reaches the end value from the initial value is corrected.

2. A data processing method according to claim 1, wherein the processing object signal is an analog pixel signal obtained from a pixel and is are set level indicating a reference component at the time when the pixel is reset and a signal level obtained by adding a true signal component to the reference component, and the count processing is performed in the up-count mode with the reset level set as the subtraction element and the signal level set as the addition element.

3. A data processing method according to claim 1, wherein the processing object signal is an analog pixel signal obtained from a pixel and is are set level indicating a reference component at the time when the pixel is reset and a signal level obtained by adding a true signal component to the reference component, and the count processing is performed in the down-count mode with the reset level set as the addition element and the signal level set as the subtraction element.

4. A data processing device comprising:

a comparing unit that compares, for each of plural analog processing object signals, a reference signal, which gradually changes, for converting the processing object signal into digital data and the respective processing object signals;

a count-period control unit that determines, on the basis of a comparison result of the comparing unit, a count period to perform, during count processing for a processing object signal of a subtraction element, the count processing in a period from a point when the processing object signal and the reference signal coincide with each other until a point when the reference signal reaches a predetermined end value and perform, during the count processing for a processing object signal of an addition element, the count processing in a period from a point when the reference signal is a predetermined initial value until a point when the processing object signal and the reference signal coincide with each other;

a count unit that performs the count processing in the count period designated by the count-period control unit, stores a count value at a point when comparison processing is completed, applies the count processing to both the subtraction element and the addition element in an identical mode of any one of an up-count mode and a down-count mode, and starts, during the count processing for a following processing object signal, the count processing using a count value stored in the count processing for a preceding processing object signal as an initial value; and a correcting unit that corrects digital data of a multiply-accumulate result of the plural processing object signals to digital data in which a count value corresponding to a period in which the reference signal in the count processing for the processing object signal of the subtraction element reaches the end value from the initial value is corrected.

5. A data processing device according to claim 4, wherein the correcting unit performs, during the count processing for a first processing object signal, the correction by causing the count processing unit to start the count processing using a value corresponding to a count value corresponding to the period in which the reference signal reaches the end value from the initial value as an initial value.

6. A data processing device according to claim 4, wherein the correcting unit applies, after the count processing for a last processing object signal is completed, the correction to the stored count value using a value corresponding to the count value corresponding to the period in which the reference signal reaches the end value from the initial value.

7. A data processing device according to claim 6, wherein, when digital data of a multiply-accumulate result of three or more processing object signals is acquired, the correcting unit applies, after the count processing for the last processing object signal is completed, the correction to the stored count value respectively using values corresponding to count values corresponding to the period in which the reference signal reaches the end value from the initial value, the values being values for respective processing object signals of subtraction elements, which are the other processing object signals excluding the first processing object signal.

8. The data processing device according to claim 4, wherein the count-period control unit synchronizes a comparison pulse indicated a comparison result of the comparing unit using a count clock of the count processing and determines respective count periods of the subtraction element and the addition element on the basis of the synchronized comparison pulse.

9. A solid-state imaging device comprising:

a reference-signal generating unit that generates, for each of plural analog processing object signals obtained from pixels, a reference signal, which gradually changes, for converting the processing object signal into digital data;

a comparing unit that compares the reference signal generated by the reference-signal generating unit and respective processing object signals;

a count-period control unit that determines, on the basis of a comparison result of the comparing unit, a count period to perform, during count processing for a processing object signal of a subtraction element, the count processing in a period from a point when the processing object signal and the reference signal coincide with each other until a point when the reference signal reaches a predetermined end value and perform, during the count processing for a processing object signal of an addition element, the count processing in a period from a point when the reference signal is a predetermined initial value until a point when the processing object signal and the reference signal coincide with each other;

a count unit that performs the count processing in the count period designated by the count-period control unit, stores a count value at a point when comparison processing is completed, applies the count processing to both the subtraction element and the addition element in an identical mode of any one of an up-count mode and a down-count mode, and starts, during the count processing for a following processing object signal, the count processing using a count value stored in the count processing for a preceding processing object signal as an initial value; and a correcting unit that corrects digital data of a multiply-accumulate result of the plural processing object signals to digital data in which a count value corresponding to a period in which the reference signal in the count processing for the processing object signal of the subtraction element reaches the end value from the initial value is corrected.

10. An imaging apparatus comprising:

a reference-signal generating unit that generates, for each of plural analog processing object signals obtained from pixels, a reference signal, which gradually changes, for converting the processing object signal into digital data;

a comparing unit that compares the reference signal generated by the reference-signal generating unit and respective processing object signals;

a count-period control unit that determines, on the basis of a comparison result of the comparing unit, a count period to perform, during count processing for a processing object signal of a subtraction element, the count processing in a period from a point when the processing object signal and the reference signal coincide with each other until a point when the reference signal reaches a predetermined end value and perform, during the count processing for a processing object signal of an addition element, the count processing in a period from a point when the reference signal is a predetermined initial value until a point when the processing object signal and the reference signal coincide with each other;

a count unit that performs the count processing in the count period designated by the count-period control unit, stores a count value at a point when comparison processing is completed, applies the count processing to both the subtraction element and the addition element in an identical mode of any one of an up-count mode and a down-count mode, and starts, during the count processing for a following processing object signal, the count processing using a count value stored in the count processing for a preceding processing object signal as an initial value;

a correcting unit that corrects digital data of a multiply-accumulate result of the plural processing object signals to digital data in which a count value corresponding to a period in which the reference signal in the count processing for the processing object signal of the subtraction element reaches the end value from the initial value is corrected; and a control unit that controls generation of a control signal for acquiring the digital data of the multiply-accumulate result.

11. An electronic device comprising:

a reference-signal generating unit that generates, for each of plural analog processing object signals, a reference signal, which gradually changes, for converting the processing object signal into digital data;

a comparing unit that compares the reference signal generated by the reference-signal generating unit and respective processing object signals;

a count-period control unit that determines, on the basis of a comparison result of the comparing unit, a count period to perform, during count processing for a processing object signal of a subtraction element, the count processing in a period from a point when the processing object signal and the reference signal coincide with each other until a point when the reference signal reaches a predetermined end value and perform, during the count processing for a processing object signal of an addition element, the count processing in a period from a point when the reference signal is a predetermined initial value until a point when the processing object signal and the reference signal coincide with each other;

a count unit that performs the count processing in the count period designated by the count-period control unit, stores a count value at a point when comparison processing is completed, applies the count processing to both the subtraction element and the addition element in an identical mode of any one of an up-count mode and a down-count mode, and starts, during the count processing for a following processing object signal, the count processing using a count value stored in the count processing for a preceding processing object signal as an initial value; and a correcting unit that corrects digital data of a multiply-accumulate result of the plural processing object signals to digital data in which a count value corresponding to a period in which the reference signal in the count processing for the processing object signal of the subtraction element reaches the end value from the initial value is corrected.

* * * * *

UNITED STATES PATENT AND TRADEMARK OFFICE
CERTIFICATE OF CORRECTION

PATENT NO. : 7,642,947 B2
APPLICATION NO. : 12/045417
DATED : January 5, 2010
INVENTOR(S) : Atsushi Suzuki et al.

It is certified that error appears in the above-identified patent and that said Letters Patent is hereby corrected as shown below:

On the Title page of the patent:

"(75) Inventors: Atushi Suzuki, Kanagawa (JP);
            Taaki Watanabe, Kanagawa (JP)"

should be

--(75) Inventors: Atsushi Suzuki, Kanagawa (JP);
            Takaki Watanabe, Kanagawa (JP)--

Signed and Sealed this

Thirtieth Day of March, 2010

David J. Kappos
*Director of the United States Patent and Trademark Office*